United States Patent
Bradford

(10) Patent No.: US 9,137,873 B2
(45) Date of Patent: Sep. 15, 2015

(54) OVERCURRENT HANDLING FOR A LIGHTING DEVICE

(75) Inventor: Everett Bradford, Apex, NC (US)

(73) Assignee: Cree, Inc., Durham, NC (US)

( * ) Notice: Subject to any disclaimer, the term of this patent is extended or adjusted under 35 U.S.C. 154(b) by 147 days.

(21) Appl. No.: 13/565,272

(22) Filed: Aug. 2, 2012

(65) Prior Publication Data
US 2013/0082602 A1   Apr. 4, 2013

Related U.S. Application Data

(60) Provisional application No. 61/542,274, filed on Oct. 2, 2011, provisional application No. 61/542,276, filed on Oct. 2, 2011, provisional application No. 61/581,781, filed on Dec. 30, 2011, provisional application No. 61/586,462, filed on Jan. 13, 2012.

(51) Int. Cl.
*H05B 37/02* (2006.01)
*H05B 33/08* (2006.01)

(52) U.S. Cl.
CPC .. *H05B 33/0893* (2013.01); *H01L 2224/48091* (2013.01); *H01L 2224/48247* (2013.01); *H01L 2924/1305* (2013.01); *H01L 2924/13033* (2013.01)

(58) Field of Classification Search
None
See application file for complete search history.

(56) References Cited

U.S. PATENT DOCUMENTS

| | | | |
|---|---|---|---|
| 4,987,348 A | 1/1991 | Wong | |
| 8,890,420 B2 | 11/2014 | Bradford | |
| 2002/0135344 A1 | 9/2002 | Tamai et al. | |
| 2005/0082553 A1 | 4/2005 | Yamamoto et al. | |
| 2007/0159736 A1 | 7/2007 | Kajita | |
| 2009/0013570 A1 | 1/2009 | Grajcar | |
| 2009/0020684 A1 | 1/2009 | Shih et al. | |
| 2010/0134020 A1 | 6/2010 | Peng et al. | |
| 2010/0156324 A1 | 6/2010 | Nagase et al. | |
| 2010/0320935 A1 | 12/2010 | Wibben | |
| 2011/0084616 A1* | 4/2011 | Negley et al. | 315/154 |
| 2011/0085576 A1* | 4/2011 | Crawford et al. | 372/38.07 |

(Continued)

FOREIGN PATENT DOCUMENTS

| | | |
|---|---|---|
| DE | 10201280 A1 | 9/2002 |
| EP | 0891120 A2 | 1/1999 |

(Continued)

OTHER PUBLICATIONS

International Search Report for PCT/US2012/058246 mailed Dec. 18, 2012, 12 pages.

(Continued)

*Primary Examiner* — Jany Richardson
(74) *Attorney, Agent, or Firm* — Withrow & Terranova, P.L.L.C.

(57) ABSTRACT

The present disclosure relates to a lighting device that employs at least one string of LEDs as a lighting source. The string of LEDs is coupled in series with a first switch, wherein the string of LEDs and the first switch are coupled between a power supply node and ground. During a normal operation mode, a system controller is configured to operate the first switch to deliver a drive current to the string of LEDs from the power supply node. The system controller is associated with circuitry that allows the system controller to monitor the drive current and determine when an overcurrent condition occurs. Upon detecting the overcurrent condition, the system controller will open the first switch to stop the drive current from flowing through the string of LEDs.

29 Claims, 18 Drawing Sheets

(56) References Cited

U.S. PATENT DOCUMENTS

| | | |
|---|---|---|
| 2011/0254554 A1 | 10/2011 | Harbers |
| 2011/0298374 A1 | 12/2011 | Lenk et al. |
| 2012/0032612 A1 | 2/2012 | Antony et al. |
| 2012/0074846 A1 | 3/2012 | Marreiro et al. |
| 2012/0104953 A1 | 5/2012 | Chobot |

FOREIGN PATENT DOCUMENTS

| | | |
|---|---|---|
| EP | 0967590 A1 | 12/1999 |
| WO | 0247438 A2 | 6/2002 |
| WO | 2008056321 A1 | 5/2008 |
| WO | 2008139369 A1 | 11/2008 |

OTHER PUBLICATIONS

International Search Report for PCT/US2012/058251 mailed Jan. 2, 2013, 11 pages.
International Search Report for PCT/US2012/058253 mailed Jan. 16, 2013, 10 pages.
International Search Report for PCT/US2012/058256 mailed Dec. 20, 2012, 12 pages.
Final Office Action for U.S. Appl. No. 13/565,113, mailed Aug. 29, 2014, 26 pages.
Notice of Allowance for U.S. Appl. No. 13/565,166, mailed Jul. 8, 2014, 8 pages.
Final Office Action for U.S. Appl. No. 13/565,220, mailed Aug. 11, 2014, 9 pages.
International Preliminary Report on Patentability for PCT/US2012/058253 mailed Jul. 10, 2014, 7 pages.
Non-Final Office Action for U.S. Appl. No. 13/565,113, mailed Apr. 11, 2014, 21 pages.
Non-Final Office Action for U.S. Appl. No. 13/565,166, mailed Mar. 14, 2014, 14 pages.
Non-Final Office Action for U.S. Appl. No. 13/565,220, mailed Mar. 27, 2014, 8 pages.
International Preliminary Report on Patentability for PCT/US2012/058246, mailed Apr. 17, 2014, 8 pages.
International Preliminary Report on Patentability for PCT/US2012/058251, mailed Apr. 17, 2014, 7 pages.
International Preliminary Report on Patentability for PCT/US2012/058256, mailed Apr. 17, 2014, 8 pages.
Advisory Action for U.S. Appl. No. 13/565,220, mailed Oct. 24, 2014, 3 pages.
Examiner's Answer to the Appeal Brief for U.S. Appl. No. 13/565,220, mailed Jun. 30, 2015, 9 pages.

* cited by examiner

OVERCURRENT HANDLING FOR A LIGHTING DEVICE

CROSS-REFERENCE TO RELATED APPLICATIONS

This application claims the benefit of U.S. provisional application Nos. 61/542,274 filed Oct. 2, 2011; 61/542,276 filed Oct. 2, 2011; 61/581,781 filed Dec. 30, 2011; and 61/586,462 filed Jan. 13, 2012, the disclosures of which are incorporated herein by reference in their entireties. This application is related to concurrently filed U.S. patent application Ser. No. 13/565,113 entitled OVER-TEMPERATURE HANDLING FOR LIGHTING DEVICE; Ser. No. 13/565,166, now U.S. Pat. No. 8,890,420, entitled TEMPERATURE CURVE COMPENSATION OFFSET; and Ser. No. 13/565,220 entitled OVER-VOLTAGE HANDLING FOR A LIGHTING DEVICE, the disclosures of which are incorporated herein by reference in their entireties.

FIELD OF THE DISCLOSURE

The present disclosure relates to a solid-state lighting device that monitors, detects, measures, senses, and/or controls current conditions, including safely handling overcurrent conditions.

BACKGROUND

In recent years, a movement has gained traction to replace incandescent light bulbs with solid-state lighting devices that employ more efficient lighting technologies. One such technology that shows tremendous promise employs light emitting diodes (LEDs). Compared with incandescent bulbs, LED-based light devices are much more efficient at converting electrical energy into light and are longer lasting, and as a result, lighting fixtures that employ LED technologies are expected to replace incandescent bulbs in residential, commercial, and industrial applications.

SUMMARY

The present disclosure relates to a lighting device that employs at least one string of LEDs as a lighting source. The string of LEDs is coupled in series with a first switch, wherein the string of LEDs and the first switch are coupled between a power supply node and ground. During a normal operation mode, a system controller is configured to operate the first switch to deliver a drive current to the string of LEDs from the power supply node. The system controller is associated with circuitry that allows the system controller to monitor the drive current and determine when an overcurrent condition occurs. Exemplary, but non-limiting overcurrent conditions are those involving a drive current that exceeds a maximum limit, exceeds a limit for a certain amount of time, an average drive current that exceeds a nominal limit, the drive current exceeding a defined limit a set number of times, and the like. Upon detecting the overcurrent condition, the system controller will open the first switch to stop the drive current from flowing through the string of LEDs.

In one embodiment, the system controller will prevent the first switch from closing again after an overcurrent condition has occurred until the system controller is reset. Cycling the power to the system controller may provide the reset. A user switching off a light switch that selectively provides power to the power supply may trigger such cycling. Requiring a reset in this embodiment helps to ensure that excessive drive current is not applied to the string of LEDs when the first switch is closed after an overcurrent condition has abated. The system controller may also act to significantly reduce the drive current in an effort to bring the drive current to an acceptable operating level.

The system controller may log information associated with the overcurrent condition and allow the information to be subsequently accessed, such as identifying whether an overcurrent condition has occurred, or providing information about an overcurrent condition. In one embodiment, an input/output (I/O) port of the system controller is reconfigured from normally being an input to being an output, and the output is tied to either a logic high or low when an overcurrent condition occurs.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure.

It will be understood that relative terms such as "front," "forward," "rear," "below," "above," "upper," "lower," "horizontal," or "vertical" may be used herein to describe a relationship of one element, layer or region to another element, layer or region as illustrated in the figures. It will be understood that these terms are intended to encompass different orientations of the device in addition to the orientation depicted in the figures.

Figure 1:
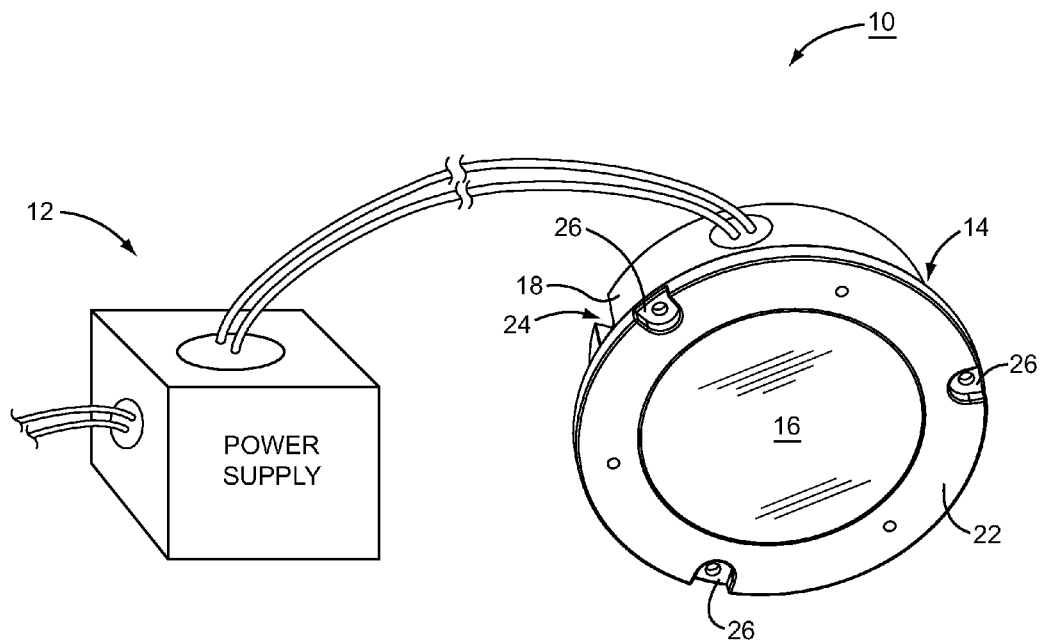
FIG. 1 is an isometric view of the front of an exemplary lighting device and power supply according to one embodiment of how the disclosure may be implemented.
Figure 2:
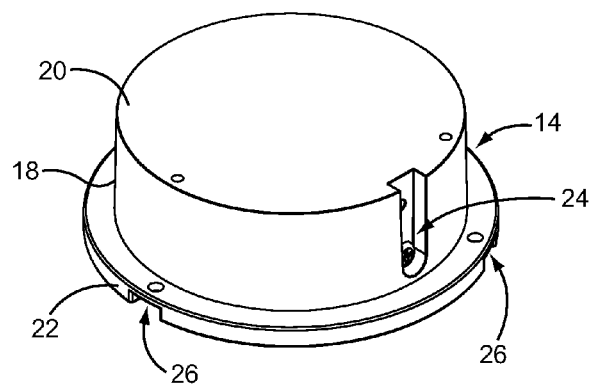
FIG. 2 is an isometric view of the back of the lighting device of FIG. 1.

The present disclosure relates to a solid-state lighting device with an improved ability to handle overcurrent conditions. For context and ease of understanding, the following description first describes an exemplary solid-state lighting device prior to describing how the solid-state lighting device may be configured to handle over-temperature conditions. With reference to FIGS. 1 and 2, a unique lighting device 10 and power supply 12 are illustrated according to one embodiment of the present disclosure. While this particular lighting device 10 is used for reference, those skilled in the art will recognize that virtually any type of solid-state lighting device may benefit from the subject disclosure.

As shown, the lighting device 10 includes a mounting structure 14 and a lens 16. The illustrated mounting structure 14 is cup-shaped and is capable of acting as a heat spreading device; however, different fixtures may include different mounting structures 14 that may or may not act as heat spreading devices. A light source (not shown), which will be described in detail further below, is mounted inside the mounting structure 14 and oriented such that light is emitted from the mounting structure through the lens 16. The electronics (not shown) that are required to drive the light source are described further below. The power supply 12 is typically coupled to an alternating current (AC) source and used to provide power to the electronics of the lighting device 10. While the lighting device 10 is envisioned to be used predominantly in 4, 5, and 6 inch recessed lighting applications for industrial, commercial, and residential applications, those skilled in the art will recognize that the concepts disclosed herein are applicable to virtually any size and application.

The lens 16 may include one or more lenses that are made of clear or transparent materials, such as polycarbonate or acrylic glass or any other suitable material. As discussed further below, the lens 16 may be associated with a diffuser for diffusing the light emanating from the light source and exiting the mounting structure 14 via the lens 16. Further, the lens 16 may also be configured to shape or direct the light exiting the mounting structure 14 via the lens 16 in a desired manner.

The power supply 12 and the lighting device 10 may be modular, wherein different sizes, shapes, and types of power supplies 12 may be connected or otherwise coupled to the mounting structure 14 of the lighting device 10 using an appropriate wiring harness. While shown as being physically separate, the power supply 12 and the lighting device 10 may be integrated to form a single structure.

In the illustrated embodiment, the mounting structure 14 is cup-shaped and includes a sidewall 18 that extends between a bottom panel 20 at the rear of the mounting structure 14, and a rim, which may be provided by an annular flange 22 at the front of the mounting structure 14. One or more elongated slots 24 may be formed in the outside surface of the sidewall 18. There are two elongated slots 24, which extend parallel to a central axis of the lighting device 10 from the rear surface of the bottom panel 20 toward, but not completely to, the annular flange 22. The elongated slots 24 may be used for a variety of purposes, such as providing a channel for a grounding wire that is connected to the mounting structure 14 inside the elongated slot 24, connecting additional elements to the lighting device 10, or as described further below, securely attaching the lens 16 to the mounting structure 14.

The annular flange 22 may include one or more mounting recesses 26 in which mounting holes are provided. The mounting holes may be used for mounting the lighting device 10 to a mounting structure or for mounting accessories to the lighting device 10. The mounting recesses 26 provide for counter-sinking the heads of bolts, screws, or other attachment means below or into the front surface of the annular flange 22.

Figure 3A:
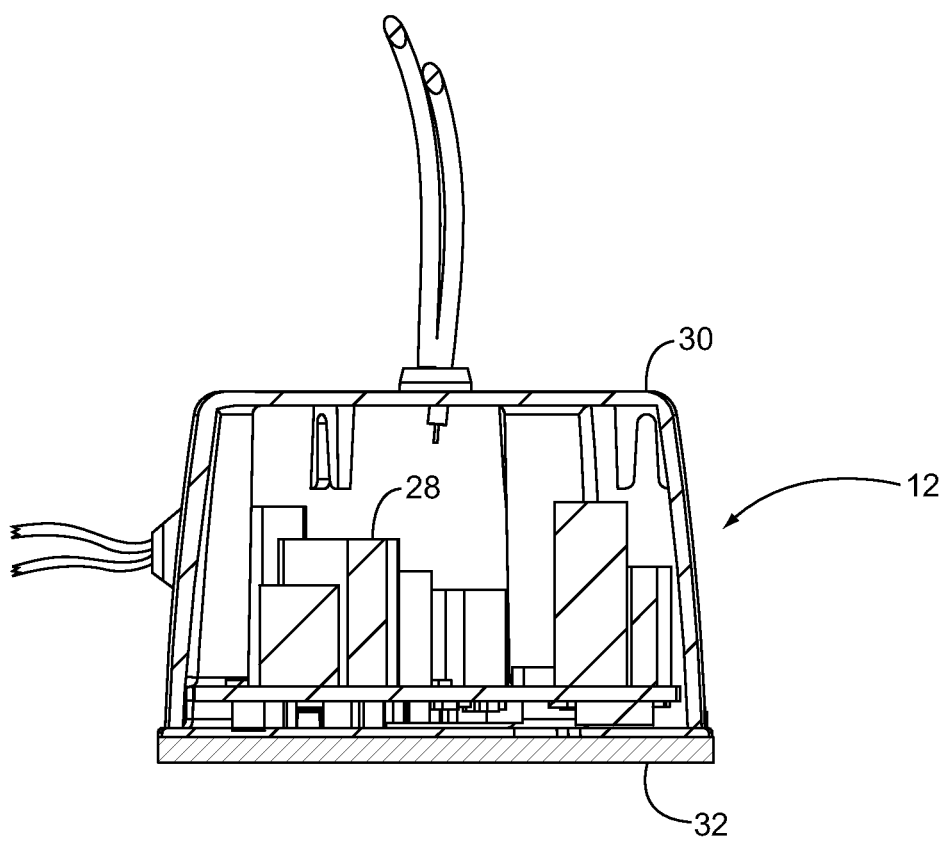
FIG. 3A is cross-sectional view of the power supply of FIG. 1.

With reference to FIG. 3A, a cross-sectional view of the power supply 12 of FIG. 1 is provided. As illustrated, the power supply 12 includes power supply electronics 28, which are encapsulated by a power supply housing 30 and a power supply cover 32. The power supply housing 30 is cup-shaped and sized sufficiently to receive the power supply electronics 28. The power supply cover 32 provides a cover that extends substantially over the opening of the power supply housing 30. Once the power supply cover 32 is in place, the power supply electronics 28 are contained within the power supply housing 30 and the power supply cover 32.

Figure 3B:
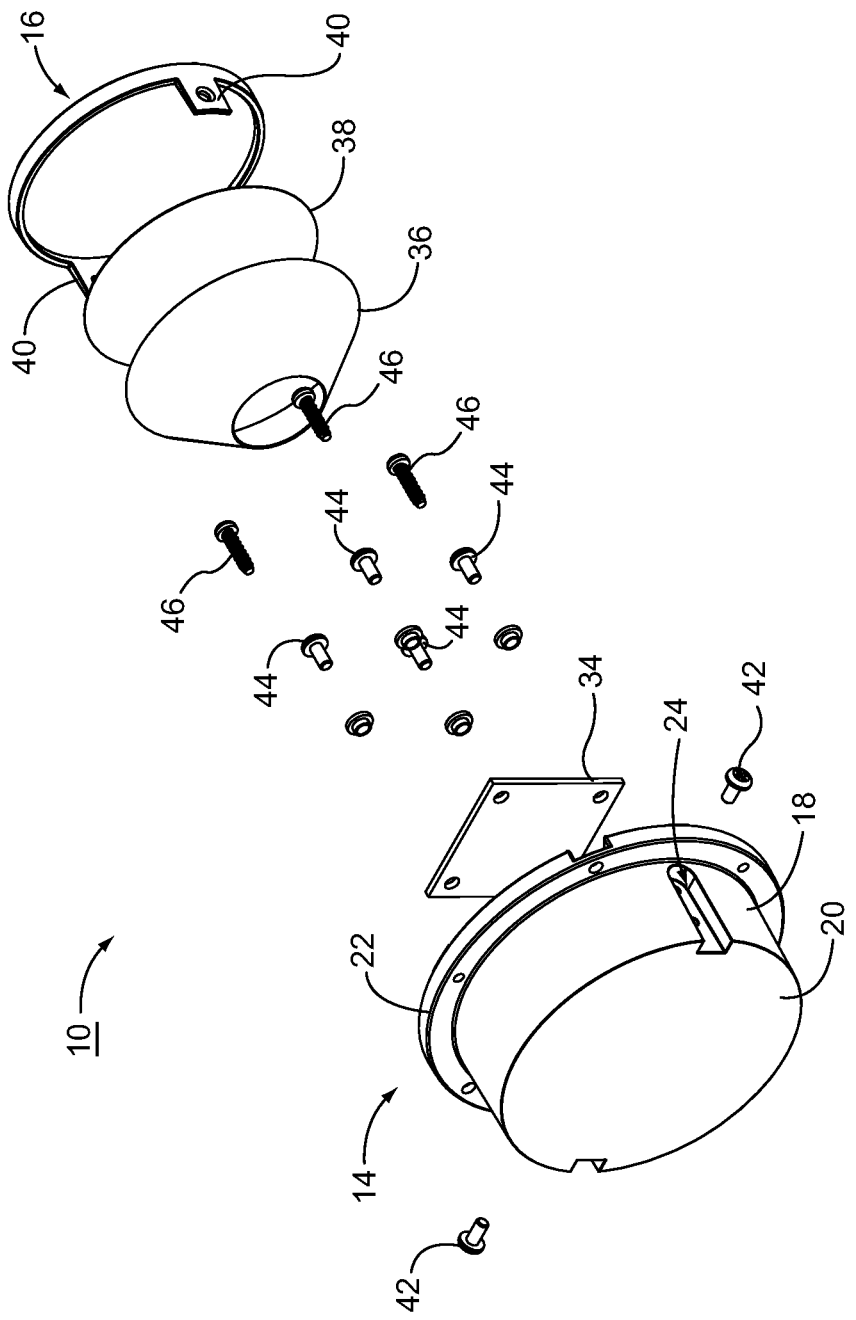
FIG. 3B is an exploded isometric view of the lighting device of FIG. 1.

The power supply electronics 28 may be used to provide power and potentially certain control signals necessary to power and control a light source module of the lighting device 10. With reference to FIG. 3B, the back of a light source module 34 is illustrated within an exploded view of the lighting device 10. The light source module 34 may be mounted on the front surface of the bottom panel 20 of the mounting structure 14 as shown, or in an aperture provided in the bottom panel 20 (not shown). Aligned holes or openings in the bottom panel 20 of the mounting structure 14 and the power supply cover 32 are provided to facilitate an electrical connection between the power supply electronics 28 in the power supply 12 and the light source module 34 of the lighting device 10.

In the illustrated embodiment, the light source module 34 employs light emitting diodes (LEDs) and associated control electronics, which are generally mounted to a printed circuit board (PCB). Among other functions, the control electronics are configured to drive the LEDs to generate light at a desired color, intensity and color temperature. Detailed operation of the light source module 34 is provided further below. The control electronics and LEDs are shown mounted on the front side of the PCB, while the rear side of the PCB is mounted to the front surface of the bottom panel 20 of the mounting structure 14 directly or via a thermally conductive pad (not shown). In this embodiment, the thermally conductive pad has a low thermal resistivity, and therefore, efficiently transfers heat that is generated by the light source module 34 to the bottom panel 20 of the mounting structure 14.

While various mounting mechanisms are available, the illustrated embodiment employs four bolts 44 to attach the PCB of the light source module 34 to the front surface of the bottom panel 20 of the mounting structure 14. The bolts 44 screw into threaded holes provided in the front surface of the bottom panel 20 of the mounting structure 14. Notably, the shape of the PCB is shown as being square, but the shape may be rectangular, circular, oval, polygonal, or the like.

A reflector cone 36 resides within the interior chamber provided by the mounting structure 14. In the illustrated embodiment, the reflector cone 36 has a conical wall that extends between a larger front opening and a smaller rear opening. The larger front opening resides at and substantially corresponds to the dimensions of front opening in the mounting structure 14 that corresponds to the front of the interior chamber provided by the mounting structure 14. The smaller rear opening of the reflector cone 36 resides about and substantially corresponds to the size of the LED or array of LEDs provided by the light source module 34. The front surface of the reflector cone 36 is generally, but not necessarily, highly reflective in an effort to increase the overall efficiency and optical performance of the lighting device 10. In certain embodiments, the reflector cone 36 is formed from metal, paper, a polymer, or a combination thereof. In essence, the reflector cone 36 provides a mixing chamber for light emitted from the light source module 34 and may be used to help direct or control how the light exits the mixing chamber through the lens 16.

Figure 4:
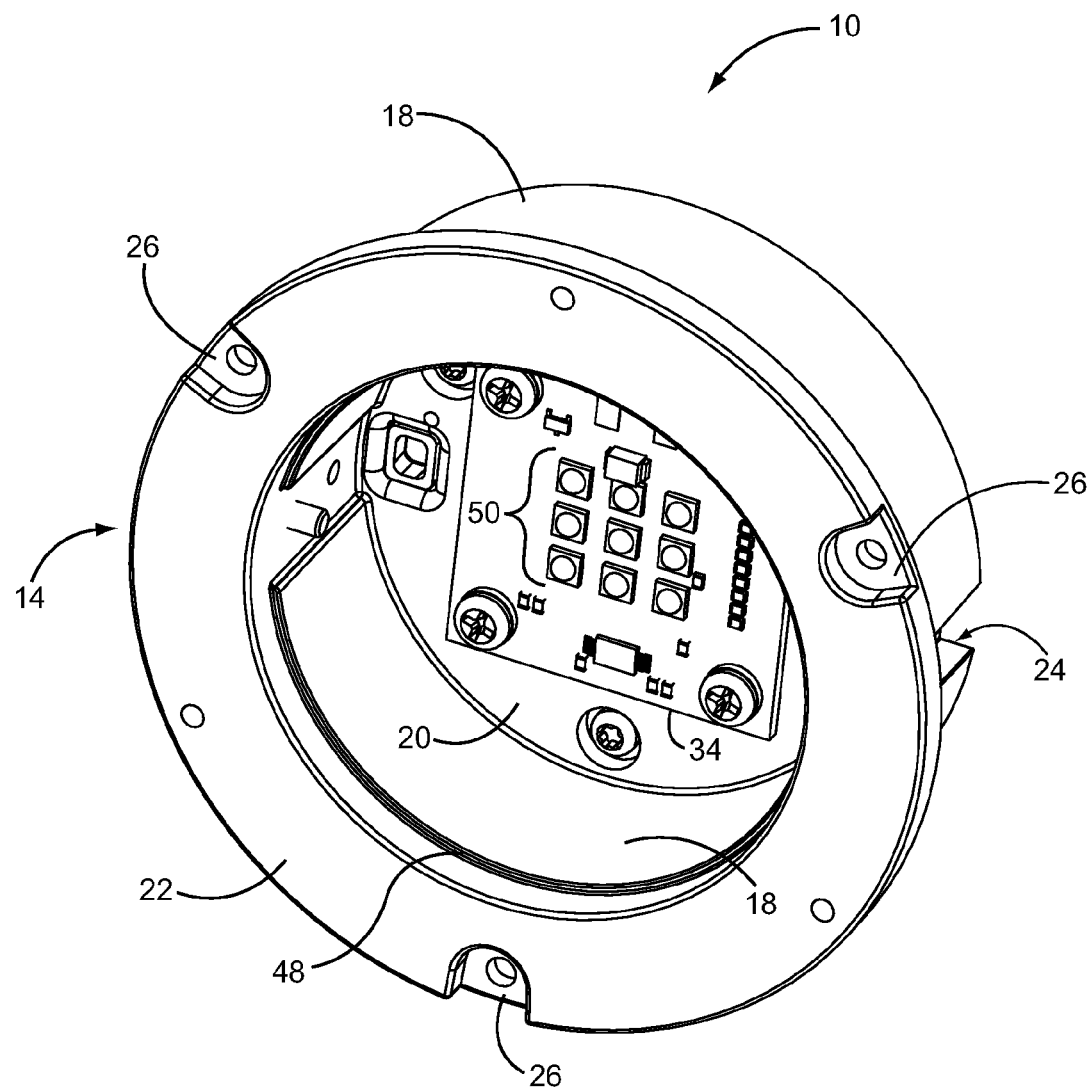
FIG. 4 is an isometric view of the front of the lighting device of FIG. 1 without the lens, diffuser, and reflector.
Figure 5:
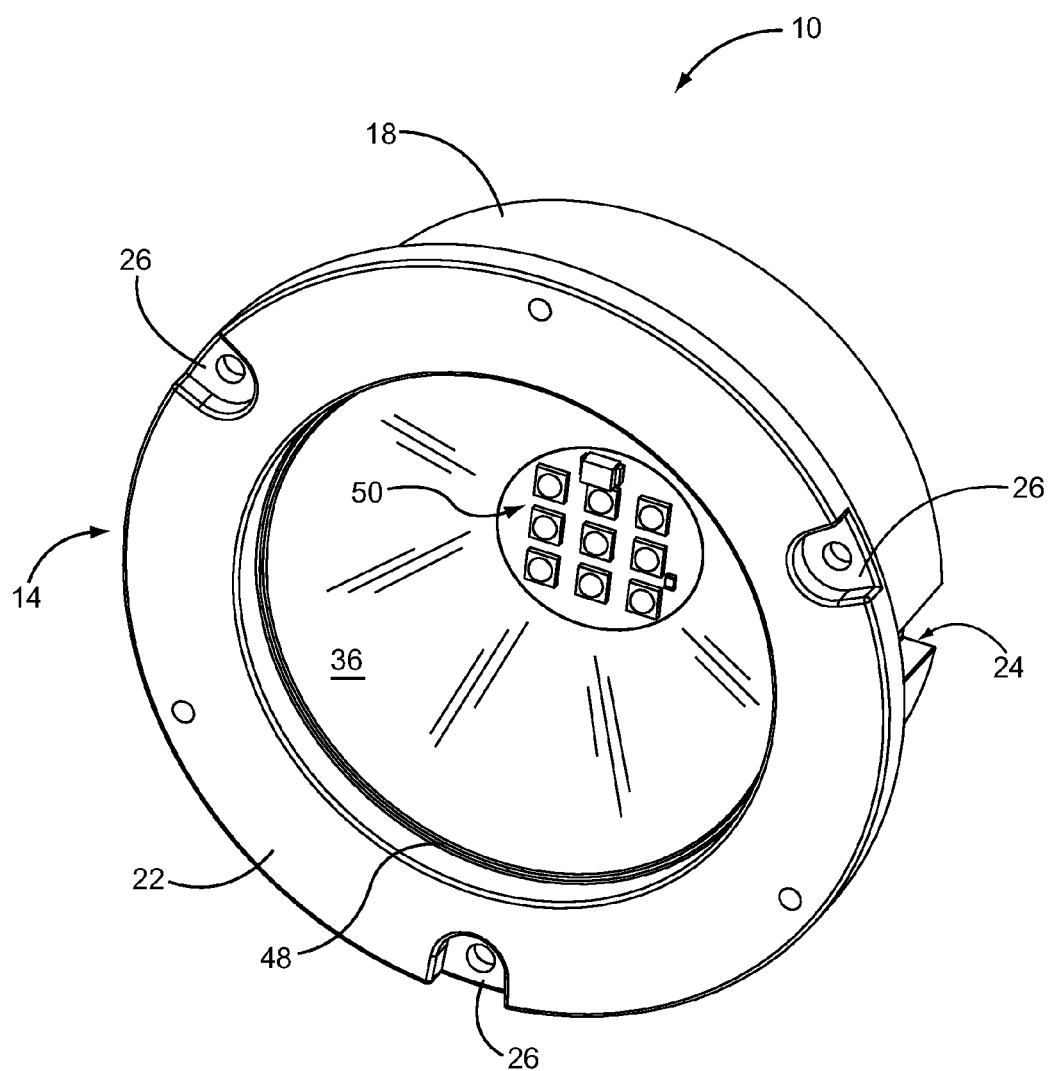
FIG. 5 is an isometric view of the front of the lighting device of FIG. 1 without the lens and diffuser.

When assembled, the lens 16 is mounted on or over the annular flange 22 and may be used to hold the reflector cone 36 in place within the interior chamber of the mounting structure 14 as well as hold additional lenses and one or more planar diffusers 38 in place. In the illustrated embodiment, the lens 16 and the diffuser 38 generally correspond in shape and size to the front opening of the mounting structure 14 and are mounted such that the front surface of the lens 16 is substantially flush with the front surface of the annular flange 22. As shown in FIGS. 4 and 5, a recess 48 is provided on the interior surface of the sidewall 18 and substantially around the opening of the mounting structure 14. The recess 48 provides a ledge on which the diffuser 38 and the lens 16 rest inside the mounting structure 14. The recess 48 may be sufficiently deep such that the front surface of the lens 16 is flush with the front surface of the annular flange 22.

Returning to FIG. 3B, the lens 16 may include tabs 40, which extend rearward from the outer periphery of the lens 16. The tabs 40 may slide into corresponding channels on the interior surface of the sidewall 18 (see FIG. 4). The channels are aligned with corresponding elongated slots 24 on the exterior of the sidewall 18. The tabs 40 have threaded holes that align with holes provided in the grooves and elongated slots 24. When the lens 16 resides in the recess 48 at the front opening of the mounting structure 14, the holes in the tabs 40 will align with the holes in the elongated slots 24. Bolts 42 may be inserted through the holes in the elongated slots 24 and screwed into the holes provided in the tabs 40 to affix the lens 16 to the mounting structure 14. When the lens 16 is secured, the diffuser 38 is sandwiched between the lens and the recess 48, and the reflector cone 36 is contained between the diffuser 38 and the light source module 34. Alternatively, a retention ring (not shown) may attach to the flange 22 of the mounting structure 14 and operate to hold the lens 16 and diffuser 38 in place.

The degree and type of diffusion provided by the diffuser 38 may vary from one embodiment to another. Further, color, translucency, or opaqueness of the diffuser 38 may vary from one embodiment to another. A separate diffuser 38, such as that illustrated in FIG. 3B, is typically formed from a polymer, glass, or thermoplastic, but other materials are viable and will be appreciated by those skilled in the art. Similarly, the lens 16 is planar and generally corresponds to the shape and size of the diffuser 38 as well as the front opening of the mounting structure 14. As with the diffuser 38, the material, color, translucency, or opaqueness of the lens 16 may vary from one embodiment to another. Further, both the diffuser 38 and the lens 16 may be formed from one or more materials or one or more layers of the same or different materials. While only one diffuser 38 and one lens 16 are depicted, the lighting device 10 may have multiple diffusers 38 or lenses 16.

For LED-based applications, the light source module 34 provides an array of LEDs 50, as illustrated in FIG. 4. FIG. 4 illustrates a front isometric view of the lighting device 10, with the lens 16, diffuser 38, and reflector cone 36 removed, such that the light source module 34 and the array of LEDs 50 are clearly visible within the mounting structure 14. FIG. 5 illustrates a front isometric view of the lighting device 10 with the lens 16 and diffuser 38 removed and the reflector cone 36 in place, such the array of LEDs 50 of the light source module 34 are aligned with the rear opening of the reflector cone 36. As noted above, the volume inside the reflector cone 36 and bounded by the rear opening of the reflector cone 36 and the lens 16 or diffuser 38 provides a mixing chamber.

Figure 6:
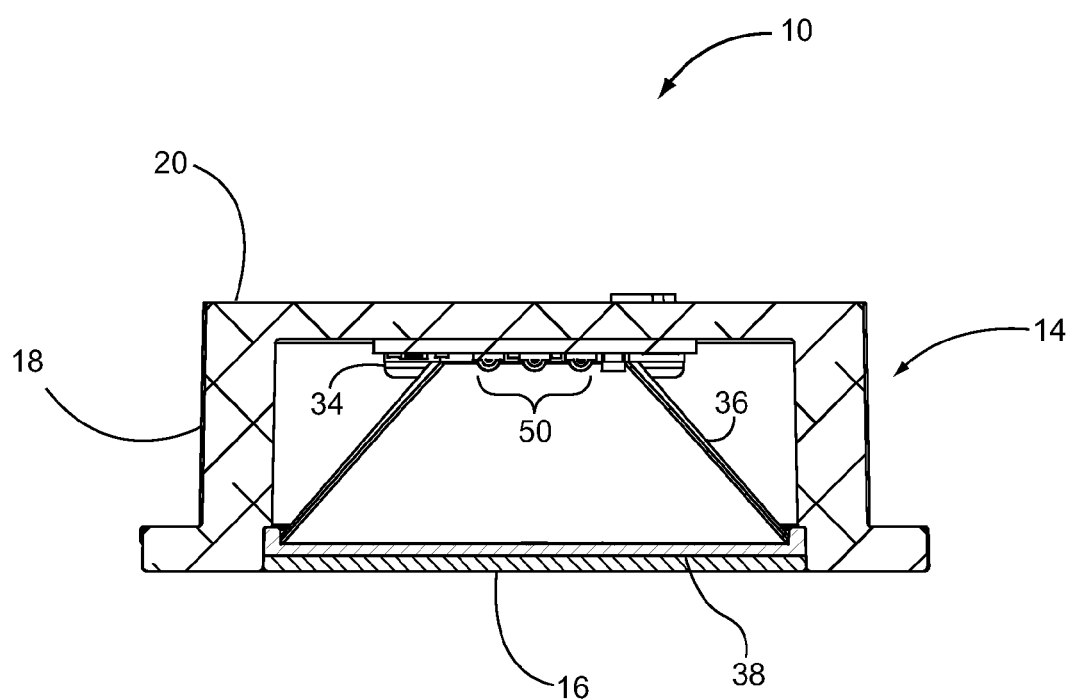
FIG. 6 is a cross-sectional view of the lighting device of FIG. 5.

Light emitted from the array of LEDs 50 is mixed inside the mixing chamber formed by the reflector cone 36 and directed out through the lens 16 in a forward direction to form a light beam. The array of LEDs 50 of the light source module 34 may include LEDs 50 that emit different colors of light. For example, the array of LEDs 50 may include both red LEDs that emit reddish light and blue-shifted yellow (BSY) LEDs that emit bluish-yellow light or blue-shifted green (BSG) LEDs that emit bluish-green light, wherein the red and bluish-yellow or bluish-green light is mixed to form "white" light at a desired color temperature. In certain embodiments, the array of LEDs may include a large number of red LEDs and BSY or BSG LEDs in various ratios. For example, two or three BSY or BSG LEDs may be associated with each red LED, and the total number of LEDs may be 10, 25, 50, 100, or more depending on the application. FIGS. 4, 5, and 6 only show nine LEDs in the array of LEDs for clarity.

For a uniformly colored beam, relatively thorough mixing of the light emitted from the array of LEDs 50 is desired. Both the reflector cone 36 and the diffusion provided by the diffuser 38 play significant roles in mixing the light emanated from the array of LEDs 50 of the light source module 34. In particular, certain light rays, which are referred to as non-reflected light rays, emanate from the array of LEDs 50 and exit the mixing chamber through the diffuser 38 and lens 16 without being reflected off of the interior surface of the reflector cone 36. Other light rays, which are referred to as reflected light rays, emanate from the array of LEDs 50 of the light source module 34 and are reflected off of the front surface of the reflector cone 36 one or more times before exiting the mixing chamber through the diffuser 38 and lens 16. With these reflections, the reflected light rays are effectively mixed with each other and at least some of the non-reflected light rays within the mixing chamber before exiting the mixing chamber through the diffuser 38 and the lens 16.

As noted above, the diffuser 38 functions to diffuse, and as result mix, the non-reflected and reflected light rays as they exit the mixing chamber, wherein the mixing chamber and the diffuser 38 provide the desired mixing of the light emanated from the array of LEDs 50 of the light source module 34 to provide a light beam of a consistent and desired color. In addition to mixing light rays, the lens 16 and diffuser 38 may be designed and the reflector cone 36 shaped in a manner to control the relative concentration and shape of the resulting light beam that is projected from the lighting device 10. For example, a first lighting device 10 may be designed to provide a concentrated beam for a spotlight, wherein another may be designed to provide a widely dispersed beam for a floodlight. From an aesthetics perspective, the diffusion provided by the diffuser 38 also prevents the emitted light from looking pixelated and obstructs the ability for a user to see the individual LEDs of the array of LEDs 50.

As provided in the above embodiment, the more traditional approach to diffusion is to provide a diffuser 38 that is separate from the lens 16. As such, the lens 16 is effectively transparent and does not add any intentional diffusion. The intentional diffusion is provided by the diffuser 38. In most instances, the diffuser 38 and lens 16 are positioned next to one another as shown in FIG. 6. However, in other embodiments, the diffusion may be integrated into the lens 16 itself.

Figure 7:
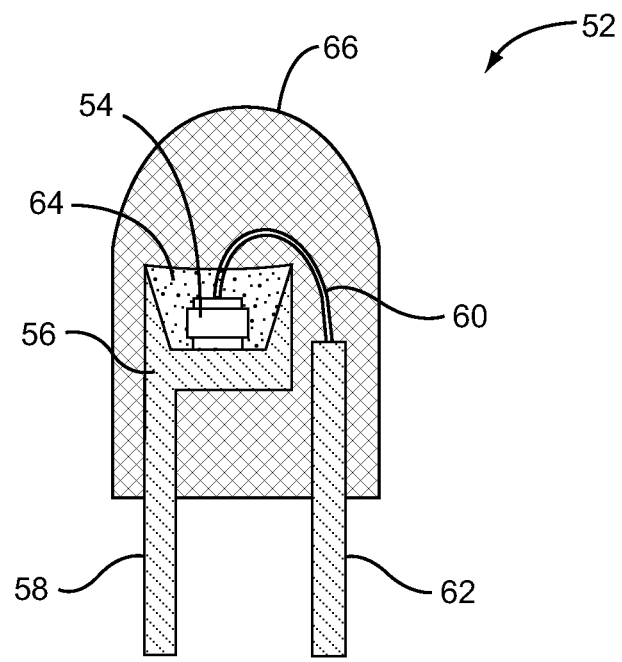
FIG. 7 is a cross-sectional view of a first type of LED architecture.

A traditional package for an LED 52 of the array of LEDs 50 is illustrated in FIG. 7. A single LED chip 54 is mounted on a reflective cup 56 using solder or a conductive epoxy, such that ohmic contacts for the cathode (or anode) of the LED chip 54 are electrically coupled to the bottom of the reflective cup 56. The reflective cup 56 is either coupled to or integrally formed with a first lead 58 of the LED 52. One or more bond wires 60 connect ohmic contacts for the anode (or cathode) of the LED chip 54 to a second lead 62.

The reflective cup 56 may be filled with an encapsulant material 64 that encapsulates the LED chip 54. The encapsulant material 64 may be clear or contain a wavelength conversion material, such as a phosphor, which is described in greater detail below. The entire assembly is encapsulated in a clear protective resin 66, which may be molded in the shape of a lens to control the light emitted from the LED chip 54.

Figure 8:
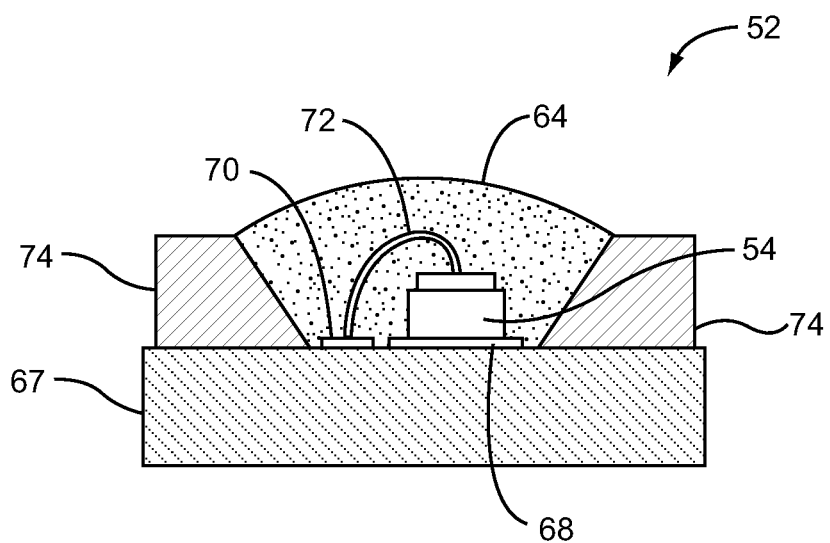
FIG. 8 is a cross-sectional view of a second type of LED architecture.

An alternative package for an LED 52 is illustrated in FIG. 8, wherein the LED chip 54 is mounted on a substrate 67. In particular, the ohmic contacts for the anode (or cathode) of the LED chip 54 are directly mounted to first contact pads 68 on the surface of the substrate 67. The ohmic contacts for the cathode (or anode) of the LED chip 54 are connected to second contact pads 70, which are also on the surface of the substrate 67, using bond wires 72. The LED chip 54 resides in a cavity of a reflector structure 74, which is formed from a reflective material and functions to reflect light emitted from the LED chip 54 through the opening formed by the reflector structure 74. The cavity formed by the reflector structure 74 may be filled with an encapsulant material 64 that encapsulates the LED chip 54. The encapsulant material 64 may be clear or contain a wavelength conversion material, such as a phosphor.

In either of the embodiments of FIGS. 7 and 8, if the encapsulant material 64 is clear, the light emitted by the LED chip 54 passes through the encapsulant material 64 and the protective resin 66 without any substantial shift in color. As such, the light emitted from the LED chip 54 is effectively the light emitted from the LED 52. If the encapsulant material 64 contains a wavelength conversion material, substantially all or a portion of the light emitted by the LED chip 54 in a first wavelength range may be absorbed by the wavelength conversion material, which will responsively emit light in a second wavelength range. The concentration and type of wavelength conversion material will dictate how much of the light emitted by the LED chip 54 is absorbed by the wavelength conversion material as well as the extent of the wavelength conversion. In embodiments where some of the light emitted by the LED chip 54 passes through the wavelength conversion material without being absorbed, the light passing through the wavelength conversion material will mix with the light emitted by the wavelength conversion material. Thus, when a wavelength conversion material is used, the light emitted from the LED 52 is shifted in color from the actual light emitted from the LED chip 54.

As noted above, the array of LEDs 50 may include a group of BSY or BSG LEDs 52 as well as a group of red LEDs 52. BSY LEDs 52 include an LED chip 54 that emits bluish light, and the wavelength conversion material is a yellow phosphor that absorbs the blue light and emits yellowish light. Even if some of the bluish light passes through the phosphor, the resultant mix of light emitted from the overall BSY LED 52 is yellowish light. The yellowish light emitted from a BSY LED 52 has a color point that typically falls above the Black Body Locus (BBL) on the 1931 CIE chromaticity diagram wherein the BBL corresponds to the various color temperatures of white light.

Similarly, BSG LEDs 52 include an LED chip 54 that emits bluish light; however, the wavelength conversion material is a greenish phosphor that absorbs the blue light and emits greenish light. Even if some of the bluish light passes through the phosphor, the resultant mix of light emitted from the overall BSG LED 52 is greenish light. The greenish light emitted from a BSG LED 52 typically has a color point that also falls above the BBL on the 1931 CIE chromaticity diagram wherein the BBL corresponds to the various color temperatures of white light.

The red LEDs 52 generally emit reddish light at a color point on the opposite side of the BBL (or below) as the yellowish or greenish light of the BSY or BSG LEDs 52. As such, the reddish light from the red LEDs 52 mixes with the yellowish or greenish light emitted from the BSY or BSG LEDs 52 to generate white light that has a desired color temperature and falls within a desired proximity of the BBL. In effect, the reddish light from the red LEDs 52 pulls the yellowish or greenish light from the BSY or BSG LEDs 52 to a desired color point on or near the BBL. Notably, the red LEDs 52 may have LED chips 54 that natively emit reddish light wherein no wavelength conversion material is employed. Alternatively, the LED chips 54 may be associated with a wavelength conversion material, wherein the resultant light emitted from the wavelength conversion material and any light that is emitted from the LED chips 54 without being absorbed by the wavelength conversion material mixes to form the desired reddish light.

The blue LED chip 54 used to form either the BSY or BSG LEDs 52 may be formed from a gallium nitride (GaN), indium gallium nitride (InGaN), silicon carbide (SiC), zinc selenide (ZnSe), or like material system. The red LED chip 54 may be formed from an aluminum indium gallium nitride (AlInGaP), gallium phosphide (GaP), aluminum gallium arsenide (AlGaAs), or like material system. Exemplary yellow phosphors include cerium-doped yttrium aluminum garnet (YAG:Ce), yellow BOSE (Ba, O, Sr, Si, Eu) phosphors, and the like. Exemplary green phosphors include green BOSE phosphors, Lutetium aluminum garnet (LuAg), cerium doped LuAg (LuAg:Ce), Maui M535 from Lightscape Materials, Inc. of 201 Washington Road, Princeton, N.J. 08540, and the like. The above LED architectures, phosphors, and material systems are merely exemplary and are not intended to provide an exhaustive listing of architectures, phosphors, and materials systems that are applicable to the concepts disclosed herein.

Figure 9:
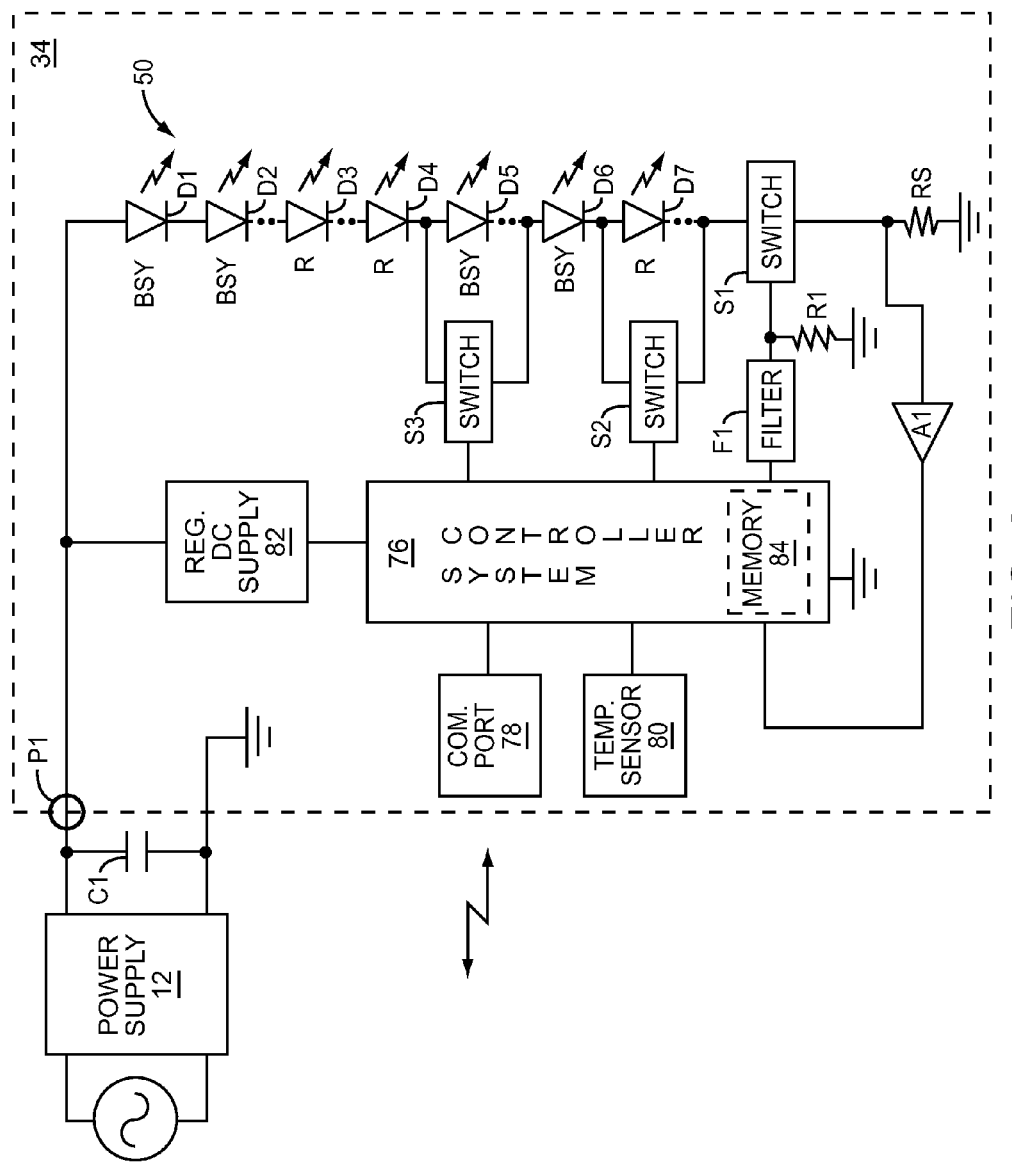
FIG. 9 is a schematic of the exemplary control module electronics according to a first embodiment of the disclosure.

As noted, the array of LEDs 50 on the light source module 34 may include a mixture of red LEDs 52 and either BSY or BSG LEDs 52. As illustrated in FIG. 9, the light source module 34 may also include a variety of control electronics, such as a system controller 76, a communication port 78, a temperature sensor 80, a regulated direct current (DC) supply 82, and memory 84. In this embodiment, the off-board power supply 12 receives a variable voltage AC signal, perhaps from a triac in a light switch (not shown) with dimming control, and provides a DC drive current to port P1 of the light source module 34. The drive current is provided at a level sufficient to drive the array of LEDs 50 at an intensity level generally commensurate to the desired lumen output of the array of LEDs 50 based on the level of dimming sensed from the AC signal received from the triac. As such, the drive current may be variable and generally corresponds to the level of dimming set at the light switch. One or more capacitors C1 may be provided at the output of the power supply 12, either internally or externally as shown, in an effort to stabilize the voltage at which the drive current is provided to the array of LEDs 50.

The drive current provided by the power supply 12 may also be used to power the system controller 76. In this embodiment, the voltage provided at port P1 is regulated down by the regulated DC supply 82 to a relatively fixed voltage to power the system controller 76. In operation, the drive current provided at port P1 is generally fixed at a maximum value for a maximum intensity level and at corresponding lesser values for any given level of dimming.

Notably, the array of LEDs 50 includes a string of series connected LEDs D1-D7 wherein the string is coupled between port P1 and a switch S1, which is coupled to ground directly or through a current sensing resistor RS, the purpose of which is described further below. For the drive current to flow through the string of series connected LEDs D1-D7 in the illustrated embodiment, the system controller 76 must close switch S1, which may be a transistor, such as a bipolar junction transistor (BJT) or field effect transistor (FET). In one embodiment, the switch S1 is an N-channel FET where the drain is coupled to the string of series connected LEDs D1-D7, the source is coupled to ground, and the gate is coupled to a control output of the system controller 76 and a pull down resistor R1, which is coupled to ground. As such, the N-channel FET (switch S1) is normally off (or open) absent the system controller 76 applying a positive voltage to the gate of the N-channel FET, because the resistor R1 will pull the gate of the N-channel FET to ground.

To direct the drive current through the string of series connected LEDs D1-D7, the system controller 76 will cause a positive voltage to be applied to the gate of the N-channel FET. When the positive voltage is applied to the gate, the N-channel FET will turn on and effectively couple the string of series connected LEDs D1-D7 to ground such that the drive current can flow through the series coupled LEDs D1-D7. The flow of drive current will cause the series connected LEDs D1-D7 to emit light at an intensity that is generally proportional to the magnitude of the drive current.

The system controller 76 may be capable of directly generating the necessary gate voltages to drive the switch S1. In the illustrated embodiment, however, the system controller 76 is further configured to provide a pulse width modulated (PWM) signal to a filter network F1, which is coupled to the gate of the transistor representing switch S1. In this configuration, the filter network F1 is a low pass filter that is capable of filtering the PWM signal to provide a variable DC signal. The voltage of the DC signal directly corresponds to the duty cycle of the PWM signal provided by the system controller. As discussed further below, the system controller 76 can control the duty cycle of the PWM signal to modulate the gate voltage provided to the transistor representing switch S1 in addition to simply turning the transistor on and off to close and open the switch S1.

As noted above, the array of LEDs 50, and thus the string of series connected LEDs D1-D7, may be of different types. In FIG. 9, only seven LEDs D1-D7 are illustrated, but any number of LEDs may be employed. As illustrated, LEDs D1, D2, D5 and D6 are of a BSY type and emit yellowish light, and LEDs D3, D4, and D7 are of a red type (R) and emit reddish light. As noted, the reddish and yellowish light emitted from the various LEDs D1-D7 mix together to form "white" light at a desired color temperature.

Switches S2 and S3 may be provided to effectively tune the color temperature, the intensity, or both the color temperature and intensity of the combined light emitted from the string of series connected LEDs D1-D7. As described below, the system controller 76 can use switch S2 to effectively control the amount of reddish light emitted the array of LEDs 50 and can use switch S3 to effectively control the amount of yellowish light emitted by the array of LEDs 50.

Switch S2 is coupled across the red type LED D7 and controlled by the system controller 76. Switch S3 is coupled across the BSY type LED D5 and also controlled by the system controller 76. Closing the switches S2 and S3 effectively provides an electrical short across the respective LEDs D7 and D5, respectively, and thus, redirects the drive current around the LEDs D7 and D5 through the switches S2 and S3.

When switch S1 is closed and switches S2 and S3 are open, the drive current flows through the string of series connected LEDs D1-D7, including LEDs D7 and D5. If switch S2 is closed while switch S1 remains closed and switch S3 remains open, the drive current bypasses LED D7, but still flows through LEDs D1-D6. If switch S3 is closed while switch S1 remains closed and switch S2 remains open, the drive current bypasses LED D5, but still flows through LEDs D1-D4 and D6-D7. Closing switch S2 effectively turns off the red type LED D7 and reduces the amount of reddish light emitted by the series connected string of LEDs D1-D7. Closing switch S3 effectively turns off the BSY type LED D5 and reduces the amount of reddish light emitted by the series connected string of LEDs D1-D7.

In operation, the system controller 76 may drive the switches S2 and S3 with individual PWM signals, each of which is effectively a series of pulses that rapidly switches the red type LED D7 and the BSY type LED D5 on and off while drive current is being provided to the string of series connected LEDs D1-D7. The respective duty cycles for the PWM signals control how long the red type LED D7 and BSY type LED D5 are on and off for a given cycle. As such, the duty cycle for the PWM signal that drives switch S2 controls the average intensity of reddish light emitted from the red type LED D7, and as such, controls the amount of reddish light the red type LED D7 adds to the overall light emitted from the other LEDs D1-D6. Similarly, the duty cycle for the PWM signal that drives switch S3 controls the average intensity of the yellowish light emitted from the BSY type LED D5, and as such, controls the amount of yellowish light the BSY type LED D5 adds to the overall light emitted from the other LEDs D1-D4 and D6-D7. While the intensity of reddish light emitted from LEDs D3 and D4 and the intensity of yellowish light emitted from LEDs D1, D2, and D6 remain relatively constant for a given drive current, the system controller 76 can control switches S2 and S3 to individually effectively vary the intensity of the reddish light emitted from LED D7 and the yellowish light emitted from LED D5, and thus the overall intensity and color temperature of the light emitted from the LEDs D1-D7 as a whole.

The switches S2 and S3 may be transistors, such as BJTs or FETs. In one embodiment, switch S2 is an N-channel FET where the drain is coupled to the anode of LED D7, the source is coupled to the cathode of LED D7, and the gate is coupled to a control output of the system controller 76. Switch S3 is an P-channel FET where the drain is coupled to the anode of LED D5, the source is coupled to the cathode of LED D5, and the gate is coupled to a control output of the system controller 76.

While connecting the power supply 12 to the light source module 34 is best done when the power supply 12 is either off or in a state where no output signal is being provided, many installers of these light source modules 34 may connect the light source module 34 to the power supply 12 when the power supply is providing an output signal. This scenario is termed "hot-plugging." Since the power supply 12 is not presented with the load of the LEDs D1-D7, and thus is not delivering the drive current, the voltage at the output (node P1) of the power supply 12 may raise significantly above a level that is safe to apply to the string of series connected LEDs D1-D7. Backed by the charge stored in the capacitor C1, applying the excessive voltage to the string of series connected LEDs D1-D7 may result in delivering an excessive current surge to the LEDs D1-D7 if and when switch S1 is closed. The excessive current may damage the LEDs D1-D7 to an extent that causes immediate failure or will lead to failure of the LEDs D1-D7 after a period time.

One aspect of the present disclosure relates to controlling the amount of drive current presented to the string of series connected LEDs D1-D7 during a hot-plugging event. The process may also be applied to any startup event. In essence, the drive current is ramped up to a desired operating level without surpassing unacceptable levels after power is applied to the light source module. In the illustrated embodiment, switch S1 is an N-channel FET, and the system controller 76 is able to dynamically control the gate voltage applied to gate of the N-channel FET in an effort to ramp the drive current in a desired fashion. The gate voltage is controlled by controlling the duty cycle of the PWM signal that is provided to filter network F1, which outputs a DC voltage proportional to the duty cycle of the PWM signal.

During certain portions of the process, the system controller 76 may monitor the drive current. The drive current may be monitored by sensing the voltage drop across the sensing resistor RS as the drive current for the string of series connected LEDs D1-D7 passes through the sensing resistor RS. To reduce the additional power consumption and voltage drop induced by the sensing resistor RS, an amplifier A1 may be employed to amplify the voltage drop sensed across the sensing resistor RS to a level more readily processed by the system controller 76.

Figure 10A:
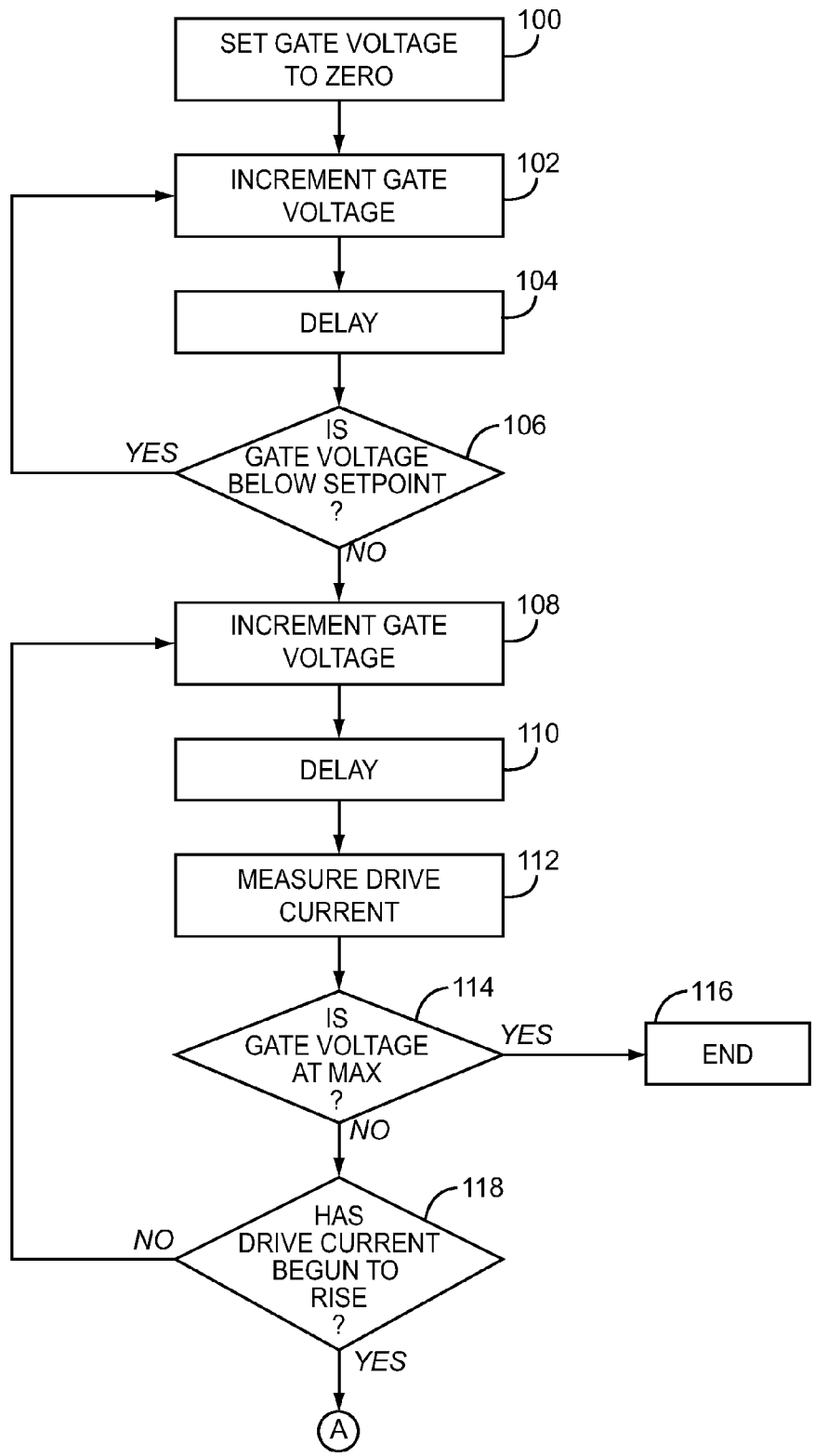
FIGS. 10A-10C are a flow diagram for a soft start process according to one embodiment of the disclosure.
Figure 10B:
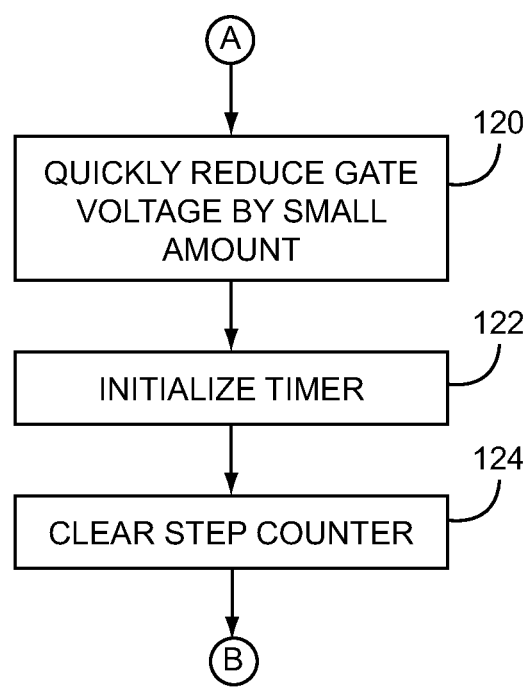
Figure 10C:
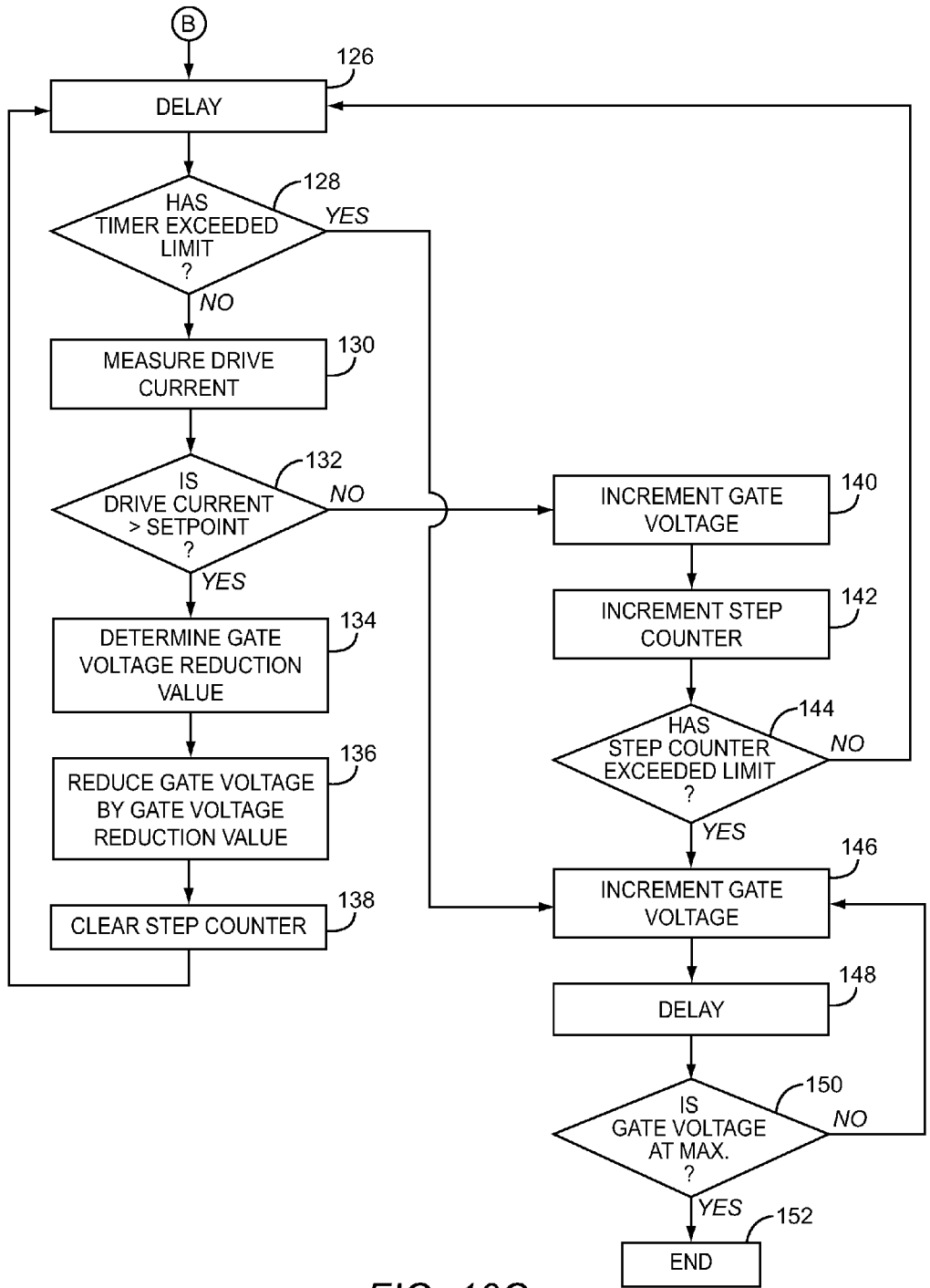
Figure 11:
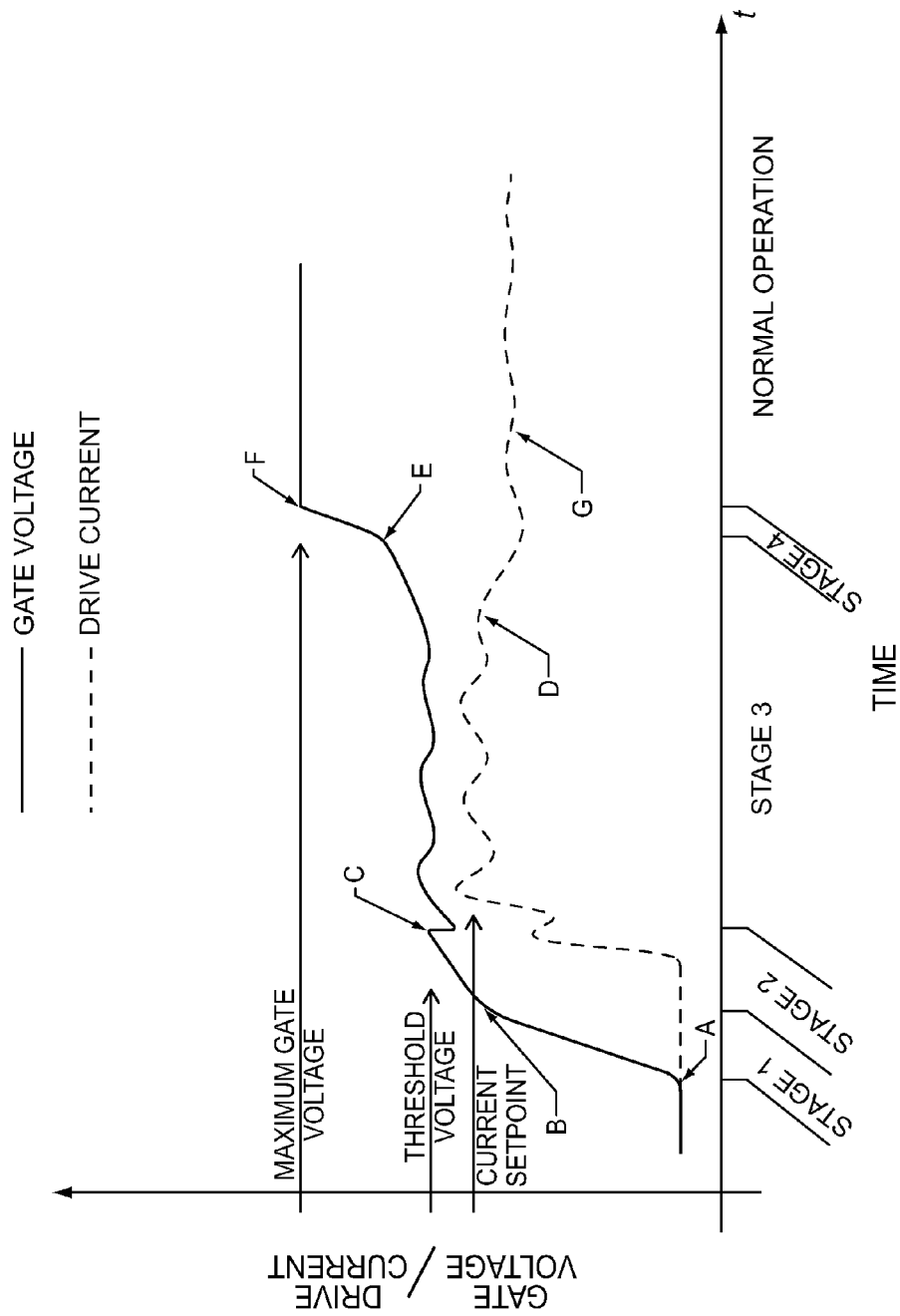
FIG. 11 is a graph plotting gate voltage and drive current for an exemplary soft start process.

An exemplary process for controlling the gate voltage is described in association with the flow diagram of FIGS. 10A-10C and the graph of FIG. 11. The graph of FIG. 11 illustrates how the gate voltage is controlled in light of the drive current. At various points in the process, a maximum gate voltage, a threshold voltage, a voltage setpoint, and a current setpoint are referenced.

The maximum gate voltage is the maximum voltage that can be provided to the gate of the switch S1 and represents the gate voltage that is normally used to fully close switch S1. The threshold voltage is the threshold voltage of the N channel FET, which represents switch S1 in the illustrated embodiment. The threshold voltage represents the gate voltage at which there is enough electrons in the channel to form a low resistance path between the drain and source of the FET. The voltage setpoint is a gate voltage that is just below the threshold voltage. The current setpoint is a drive current level that is slightly above the normal operating drive current level and below an unacceptable drive current level.

For the following description, each step in the flow diagram of FIGS. 10A-10C is referenced as "(step n)," where n is the reference number for the corresponding step in the flow diagram. Each of the defined points A through F in the graph of FIG. 11 is referenced as "(point m)," where m is the reference number for the corresponding point in the graph. The process illustrated includes five stages during a soft start process for a hot-plugging event before assuming normal operation. Stage 1 is a relatively fast ramping of the gate voltage to the voltage setpoint. Stage 2 is a relatively slow ramping of the gate voltage to the threshold voltage. Stage 3 is a feedback control stage where the gate voltage is modulated in response to the drive current levels. Stage 4 is a relatively fast ramping of the gate voltage to the maximum gate voltage.

As the system controller 76 powers up during a hot-plugging event (point A), the gate voltage is set to zero, which effectively keeps switch S1 open such that no drive current passes through the string of series connected LEDs D1-D7 (step 100). For stage 1, the gate voltage is incremented (step 102) and held at the incremented value for a very short delay of approximately 5 to 10 microseconds (step 104). After the very short delay, the system controller 76 will determine whether the gate voltage is below the voltage setpoint (step 106).

If the gate voltage is below the voltage setpoint, the process of incrementing the gate voltage (step 102), holding the incremented gate voltage for the given delay (step 104), and determining whether the gate voltage is below the voltage setpoint (step 106) is repeated until the gate voltage is eventually incremented to a level that is equal to the voltage setpoint. Determining whether the gate voltage is below the voltage setpoint may include associating the voltage setpoint with a fixed number of gate voltage increments and comparing the how many times the gate voltage has been incremented with the fixed number of gate voltage increments. The very short delay in the loop imposed by step 104 causes a relatively fast ramping of the gate voltage to the voltage setpoint.

Stage 2 is entered when the gate voltage is incremented to a level that is equal to the voltage setpoint (point B). In stage 2, the gate voltage is again incremented (step 108) and held at the incremented value for a short delay of approximately 100 to 150 microseconds (step 110). After the short delay, the system controller measures the drive current (step 112) and determines whether the gate voltage is at the maximum gate voltage (step 114). If the gate voltage is at the maximum gate voltage, the gate voltage has reached its maximum value, no further ramping is possible, the process is exited, and the process ends (step 116). Normally, it would be unusual for the process to end at this point.

If the gate voltage has not reached the maximum value, the system controller 76 will determine whether the drive current has begun to rise (step 118). If the drive current has not begun to rise, the process of incrementing the gate voltage (step 108), holding the incremented gate voltage for the given delay (step 110), measuring the drive current (step 112), determining whether the gate voltage has reached the maximum gate voltage (step 114), and determining whether the drive current has began to rise (step 118) is repeated until the drive current begins to rise. The short delay in the loop imposed by step 110, as opposed to the very short delay of step 104, causes a relatively slow ramping of the gate voltage to the threshold voltage. The threshold voltage corresponds to the gate voltage level where the switch S1 begins to conduct, and thus allow the drive current to flow.

Once the gate voltage is incremented to the threshold voltage and the drive current to begins to rise, the process transitions from stage 2 to stage 3 (point A). Upon determining that the drive current is beginning to rise, or flow, the system controller 76 will quickly reduce the gate voltage by a small amount, such as approximately 200 to 300 millivolts for the illustrated embodiment (step 120). Reducing the gate voltage quickly upon detecting that the drive current has begun to flow effectively prevents the FET-based switch S1 from quickly and fully turning on, thus allowing an excessive drive current to flow through the LEDs D1-D7. As provided below, stage 3 involves modulating the gate voltage about the threshold voltage to prevent excessive drive currents through the LEDs D1-D7 as the capacitor C1 of the power supply 12 is discharged to an acceptable voltage level and normal operation can ensue.

Once the gate voltage is dropped, a timer is initialized (step 122) and a step counter is cleared (step 124). As seen below, the timer may be used to force the gate voltage to the maximum voltage, and thus, fully close switch S1 and ensure that the drive current reaches normal operating levels within a set period of time. Similarly, the step counter is employed to determine when to force the gate voltage to the maximum voltage after there is an indication that the charge stored by capacitor C1 of the power supply 12 has dropped to a safe level.

After the step counter is cleared (step 124), the gate voltage is held for another short delay of approximately 2 to 2.5 microseconds (step 126). The system controller 76 will then determine if the timer has exceed a predetermined limit (step 128), and if the limit is not exceeded, the drive current is measured (step 130). Next, the system controller will determine if the drive current is greater than the current setpoint (step 132). If the current is above the current setpoint, the system controller 76 either calculate a gate voltage reduction value or access a fixed gate voltage reduction value (step 134) and then reduce the gate voltage by the gate voltage reduction value (step 136). If calculated, the gate voltage reduction value may be based on a difference between the drive current and the current setpoint wherein the greater the difference the greater the gate voltage reduction value. As such, the system controller 76 will reduce the gate voltage in an effort to reduce the drive current when the drive current is above the current setpoint. The step counter is then cleared (step 138) and the process iteratively loops back to the short delay (step 126). During these iterations, the gate voltage is systematically reduced until the system controller 76 determines that the drive current is less or equal to the current setpoint.

If the drive current is less than or equal to the current setpoint (step 132), the gate voltage is incremented in an effort to increase the drive current (step 140). After the gate voltage is incremented, the step counter is incremented (step 142), and the system controller 76 checks to see if the step counter has exceeded the predefined limit (step 144). Thus, the gate voltage is systematically increased until the system controller 76 determines that the drive current is greater than the current setpoint. In normal operation during at least the initial portion of stage 3, the gate voltage will oscillate about the threshold voltage, and the drive current will oscillate about the current setpoint. During the later portion of stage 3, the gate voltage will continue to increase toward the maximum voltage, and the drive current will converge toward the normal operating drive current. The transition from the initial portion and the later portion generally corresponds to the charge in the capacitor C1 of the power supply dropping to a level that is close to a normal level (point D).

Stage three ends after either the timer has exceeded the predefined limit (step 128) or the step counter exceeds its predefined limit (step 144). The latter is indicative that the charge stored by the capacitor C1 of the power supply 12 has dropped to a safe level. When stage 3 ends, the process transitions to stage 4 and invokes a relatively fast ramping of the gate voltage to the maximum gate voltage (point E). Stage 4 begins by incrementing the gate voltage (step 146) and holding the gate voltage at the incremented level for a very short delay of approximately 3 to 5 microseconds (step 148). After the delay, the system controller 76 determines whether the gate voltage has reached the maximum gate voltage (step 150).

If the gate voltage has not reached the maximum gate voltage, the process of stage 4 is repeated, such that the gate voltage is systematically and relatively rapidly incremented (step 146) until it reaches the maximum gate voltage (step 150). Once the gate voltage has reached the maximum gate voltage (point F), stage 4 and the process ends (step 152). At this point, the gate voltage is maintained at the maximum gate voltage and the drive current has settled at a normal operating level (point G). The time to complete all stages generally takes approximately 20 to 40 milliseconds, if the ramping of the gate voltage, and thus the drive current, is not to be perceived by the human eye. After the process ends, switch S1 is closed.

With switch S1 closed, the drive current provided by the power supply 12 is delivered through LEDs D1-D7, if the system controller 76 is configured to power up with switches S2 and S3 open. If the system controller is configured to power up with one or both of switches S2 and S3 closed, the drive current will bypass the corresponding one or both of the LEDs D7 and D5. After powering up, the system controller 76 will begin sending the respective PWM signals to switches S2 and S3 to control the amount of reddish and yellowish light emitted from the respective LEDs D7 and D5, and thus, set the overall intensity, color temperature, and the like of the overall light emitted from the lighting device 10.

During normal operation, the system controller 76 may monitor the temperature of, at, or proximate the light source module 34 as provided by the temperature sensor 80 in an effort to detect an over-temperature condition of the array of LEDs 50. The temperature sensor 80 may be separate from or integrated with the system controller 76 and may include a resistive, inductive, capacitive, or semiconductive element that varies with temperature. An over-temperature condition may correspond to the monitored temperature exceeding a maximum threshold, the monitored temperature exceeding a nominal threshold for a given period of time, or the like. For example, an over-temperature condition may be triggered any time the monitored temperature exceeds 160° Fahrenheit or when the monitored temperature exceeds 140° Fahrenheit for more than ten (10) minutes. Other and more complex schemes are possible and are considered within the scope of this disclosure. For example, the monitored temperature may be integrated over time and compared to a given threshold.

If the system controller 76 detects an over-temperature condition, a shutdown procedure is invoked. The shutdown procedure entails opening switch S1 to stop the flow of the drive current through the LEDs D1-D7. Since the LEDs D1-D7 are a primary source of heat generation when the drive current is applied, stopping the flow of drive current through the LEDs D1-D7 significantly reduces the generation of heat by the light source module 34.

Since the power supply 12 may not recognize the over-temperature condition on the light source module 34 and that the drive current is no longer being supplied to the LEDs D1-D7, the power supply 12 will continue to try to supply power to the light source module 34. Since the drive current for the LEDs D1-D7 is no longer passed through LEDs D1-D7, the voltage at the output (node P1) of the power supply may raise significantly given the reduced load. Thus, even if the over-temperature condition abates, the higher voltage provided by the output of the power supply 12 at port P1 may exceed what is safe to apply to the string of series connected LEDs D1-D7. Backed by the charge stored in the capacitor C1, applying the excessive voltage to the string of series connected LEDs D1-D7 by closing switch S1 may result in delivering an excessive current surge to the LEDs D1-D7. The excessive current may damage the LEDs D1-D7 to an extent that causes immediate failure or will lead to failure of the LEDs D1-D7 after repeated over-temperature conditions are experienced.

To avoid damaging the LEDs by simply closing switch S1 when the power supply voltage is too high, the present disclosure proposes different protection scenarios. The first protection scenario invokes the same soft start process as that used to control the drive current during a hot-plugging event. The second protection scenario involves having the system controller 76 enter a state that prohibits switch S1 from being closed until a system reset occurs. A system reset will typically involve removing the power that is supplied to the power supply 12, such as when a light switch is turned off. When power is no longer supplied to the power supply 12, the power supply itself will stop providing the power to the port P1. However, the capacitor C1 along with any output capacitance of the power supply 12 will have a charge stored at the excessive voltage levels. This charge will be drained by the electronics of the light source module 34, and in particular, by the system controller 76. As the charge is drained, the voltage supplied to the DC supply 82 will decrease until the minimum operating voltage of the system controller 76 can no longer be provided by the DC supply 82 to the system controller 76. At this point, the system controller 76 will stop functioning. The electronics of the system controller 76 will ensure that the switch S1 stays off until the system controller 76 can no longer function due to the decaying operating voltage.

When power is again supplied to the power supply 12, the power supply 12 will again provide power to the light source module 34. As power is applied, the system controller 76 will power up in a state where switch S1 is closed or implement the soft start process described above. With switch S1 closed, the drive current will flow though the string of series connected LEDs D1-D7 before the voltage on port P1 reaches excessive levels. In short, the power supply 12 is presented an initial load when power is applied, and by presenting the initial load, the power supply 12 is prevented from supplying excessive loads to the array of LEDs 50.

Upon powering up, the system controller 76 will check to see if there is an over-temperature condition. If an over-temperature condition exists, the system controller 76 will again open switch S1 to effectively turn off the array of LEDs 50. Again, the system controller 76 will keep switch S1 open until a system reset occurs. In essence, the system controller 76 may force a user to shut off power to the lighting device 10 and to leave it off for a sufficient amount of time to drain the capacitive charge stored in the power supply 12 to at least a safe level before allowing the drive current to be presented to the array of LEDs 50. Further, the system controller 76 ensures that the array of LEDs 50 are not excessively subjected to over-temperature conditions.

Figure 12:
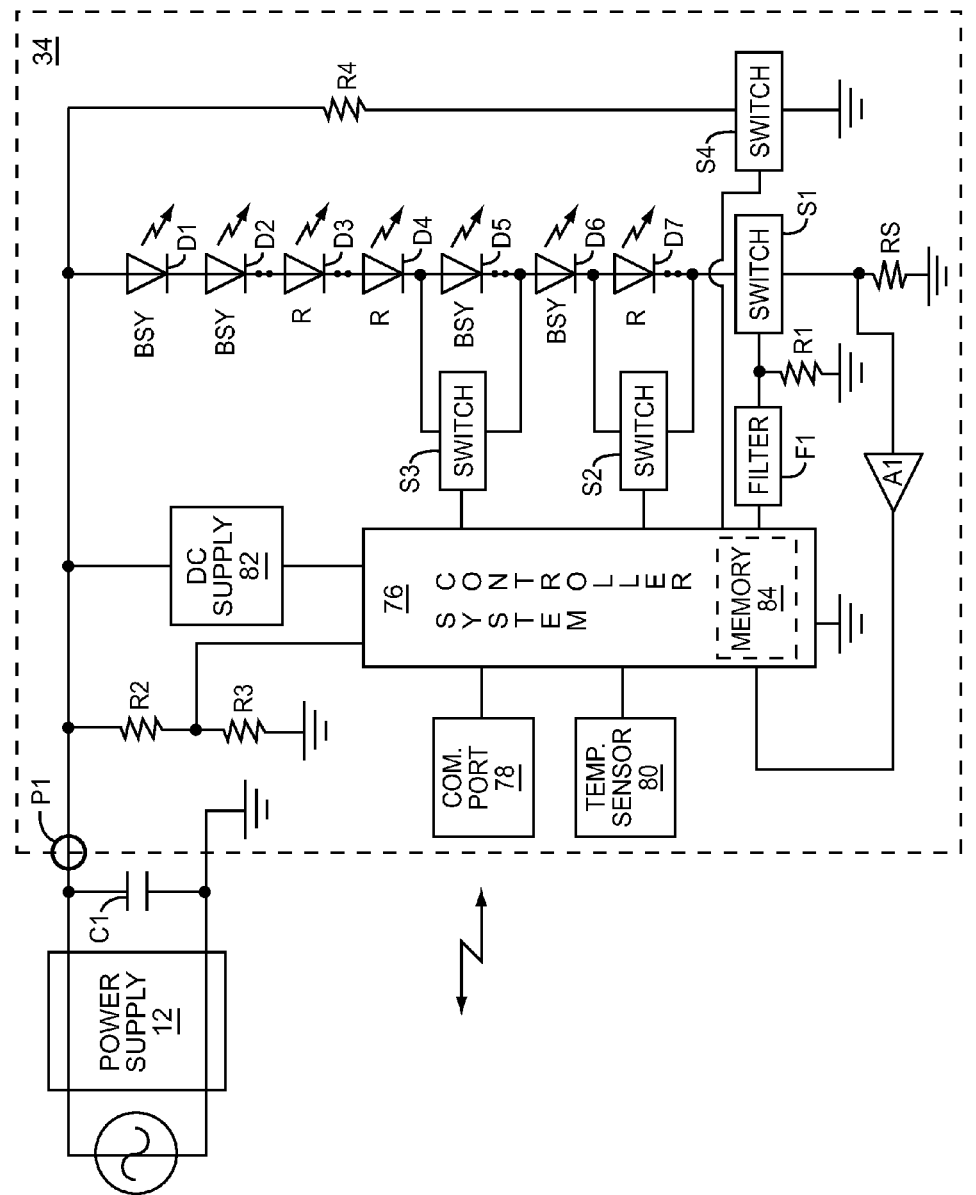
FIG. 12 is a schematic of the exemplary control module electronics according to a second embodiment of the disclosure.

In a third protection scenario, the system controller 76 is also configured to monitor the voltage at port P1 and take action to open switch S1 in the case of an excessive-voltage condition at port P1, prevent the closing of switch S1 if there is an excessive-voltage condition at port P1, or trigger the soft start process. With reference to FIG. 12, the light source module 34 is configured with a voltage divider circuit formed by resistors R2 and R3. Resistors R2 and R3 are connected in series between port P1 and ground. The node where resistors R2 and R3 are connected provides the voltage divider output and is coupled to the system controller 76. The voltage divider output is directly proportional to the voltage at port P1, and as such, the system controller 76 can monitor the voltage divider output and determine the actual or relative voltage at the port P1. If the voltage of the voltage divider output exceeds a defined threshold, an excessive voltage condition is detected by the system controller 76, which will either open the switch S1, if the switch S1 is closed, prevent switch S1 from being closed while the excessive voltage condition is present, or trigger the soft start process.

In this embodiment, the light source module 34 is illustrated as having a resistor R4 and switch S4, which are connected in series between port P1 and ground. If an excessive voltage condition is present because switch S1 is open and the voltage at port P1 has floated to an excessive level because there is no drive current being provided to the LEDs D1-D7, the system controller 76 can close switch S4 to present resistor R4 as a load to the power supply 12. Resistor R4 may have a resistance approximating the resistive load of the string of series connected LEDs D1-D7, and thus draw a drive current that is analogous to that drawn by the LEDs D1-D7 from the power supply 12. Directing the drive current through resistor R4 will effectively reduce the voltage at port P1 to a safe level. Once the voltage at port P1 reaches a safe level, the system controller 76 may close switch S1 and immediately open switch S4 to redirect the drive current from resistor R4 to the LEDs D1-D7. The use of switch S4 may be used in association with or in lieu of the soft start process.

Figure 13:
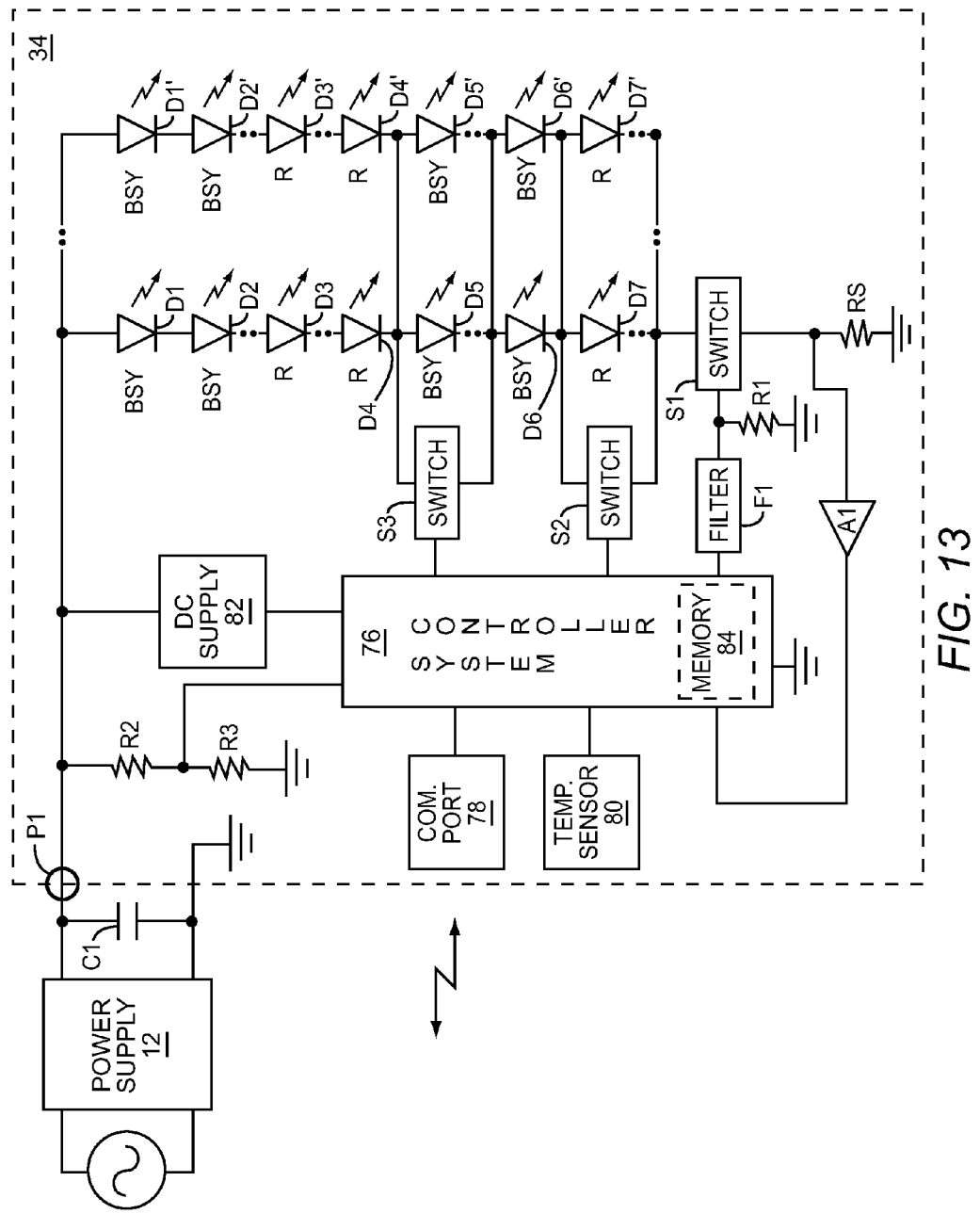
FIG. 13 is a schematic of the exemplary control module electronics according to a third embodiment of the disclosure.

While FIGS. 9 and 12 illustrate only one string of series connected LEDs D1-D7, any number of strings may be employed. FIG. 13 illustrates an embodiment with at least two strings. The first string includes series connected LEDs D1-D7 while the second string includes series connected LEDs D1'-D7'. In this embodiment, the drive current is selectively delivered to both strings at the same time by closing switch S1. Further, switch S2 is coupled across LED D7 in the first string and D7' in the second string such that the system controller 76 can control the amount of reddish light emitted by LEDs D7 and D7'. Switch S3 is coupled across LED D5 in the first string and D5' in the second string such that the system controller 76 can control the amount of yellowish light emitted by LEDs D5 and D5'. Using additional strings of LEDs generally correlates to greater lumen output of the array of LEDs 50.

Figure 14:
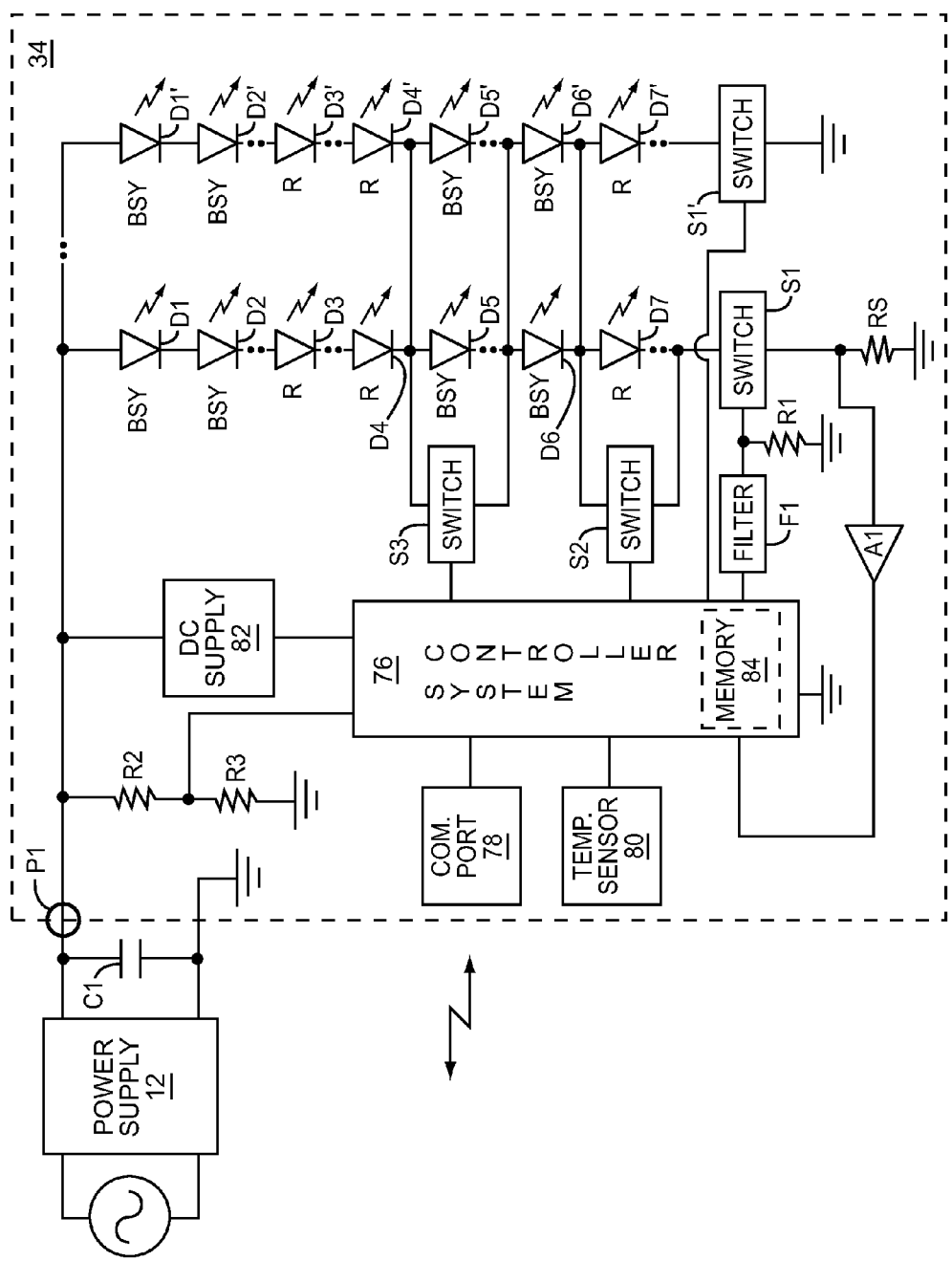
FIG. 14 is a schematic of the exemplary control module electronics according to a fourth embodiment of the disclosure.

Notably, each string could be separately coupled to ground using different switches S1 and S1', as illustrated in FIG. 14. The system controller 76 may open and close both of the switches S1 and S1' at the same time. Switches S2 and S3 may be used to fine tune the amount of reddish and yellowish light in the overall mix of light emitted from the array of LEDs 50. This concept is scalable to any number of strings. Further, when multiple strings are used, certain strings may be used solely for one type of LED while other strings may be used solely for another type of LED. The concepts of over-temperature and excessive voltage protection apply to these embodiments with multiple strings of series connected LEDs D1-D7, D1'-D7'.

In addition to tracking and protecting the lighting device 10 from over-temperature and over-voltage conditions during normal operation and overcurrent conditions when initially connected to the power supply 12, the lighting device 10 may also track and protect against overcurrent conditions during operation. In the illustrated embodiment during a normal operation mode, the system controller 76 is configured to keep the switch S1 so the drive current is provided to the string of LEDs from the power supply node P1. The system controller 76 may continuously or systematically monitor the drive current passing through the string of series connected LEDs D1-D7 by sensing the voltage drop across the sensing resistor RS as the drive current passes through the sensing resistor RS. As noted above, the amplifier A1 may be employed to amplify the voltage drop sensed across the sensing resistor RS to a level more readily processed by the system controller 76. Those skilled in the art will recognize other possible current monitoring techniques.

The system controller 76 will monitor the drive current and detect overcurrent conditions. An overcurrent condition may be defined as a drive current that exceeds a maximum limit, a drive current that exceeds a defined limit for a certain amount of time, an average drive current that exceeds a nominal limit, the drive current exceeding a defined limit a set number of times, and the like. The designer of the lighting device 10 may define an overcurrent condition to best protect the electronics of the lighting device 10.

Upon detecting an overcurrent condition, the system controller 76 may immediately open the switch S1 to stop the drive current from flowing through the string of LEDs, as done in response to an over-temperature condition. The system controller 76 may also prevent the switch S1 from closing again after an overcurrent condition has occurred until the system controller 76 is reset. Cycling the power to the system controller 76 may provide the reset. A user switching off a light switch that selectively provides power to the power supply 12 may trigger such cycling. As an alternative, the system controller 76 could control the duty cycle of the PWM signal to modulate the gate voltage provided to the transistor, which is shown as representing switch S1, in order to reduce the drive current to a safe level.

Figure 15A:
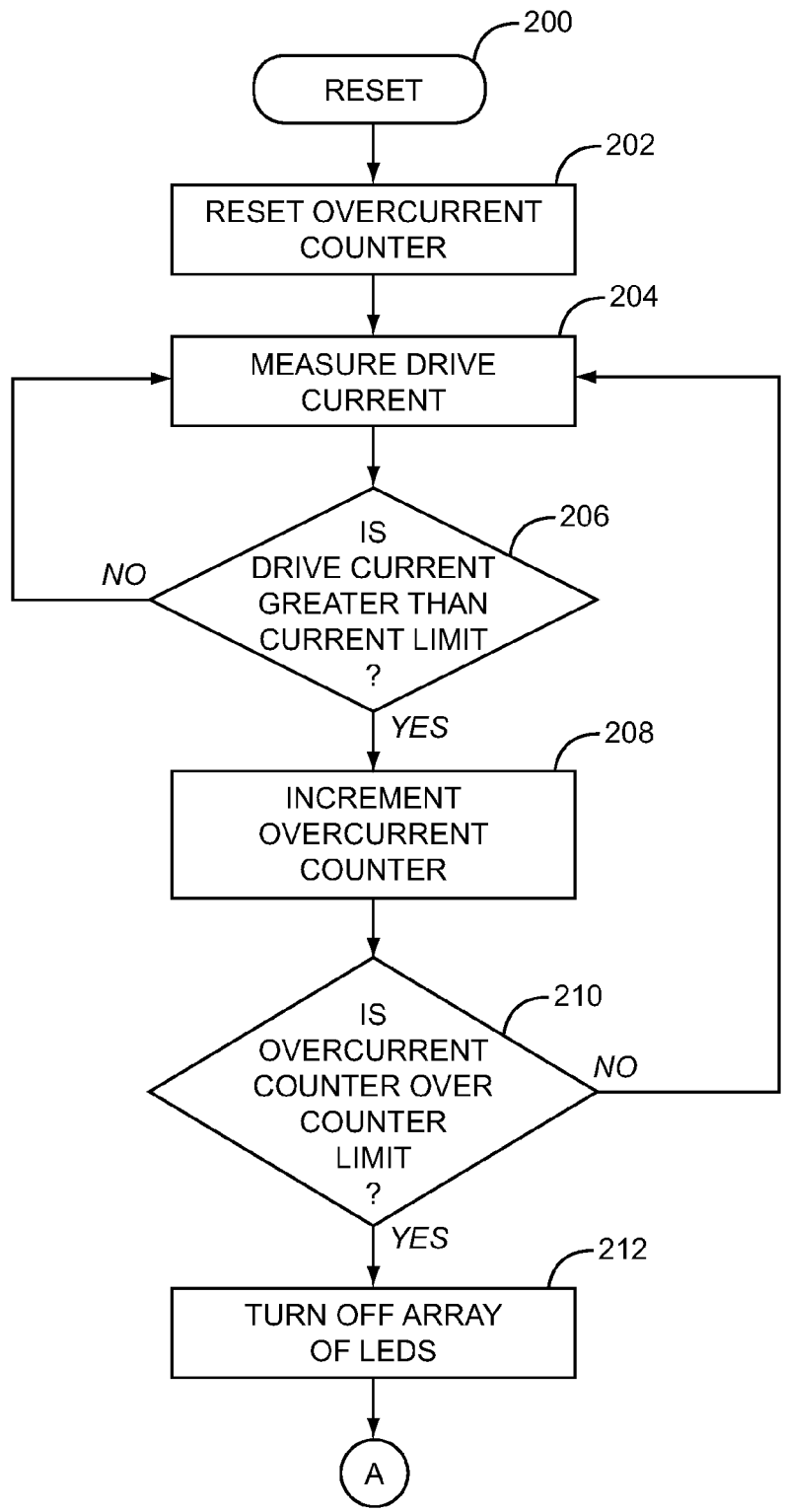
FIGS. 15A and 15B are a flow diagram for an overcurrent detection and handling start process according to one embodiment of the disclosure.
Figure 15B:
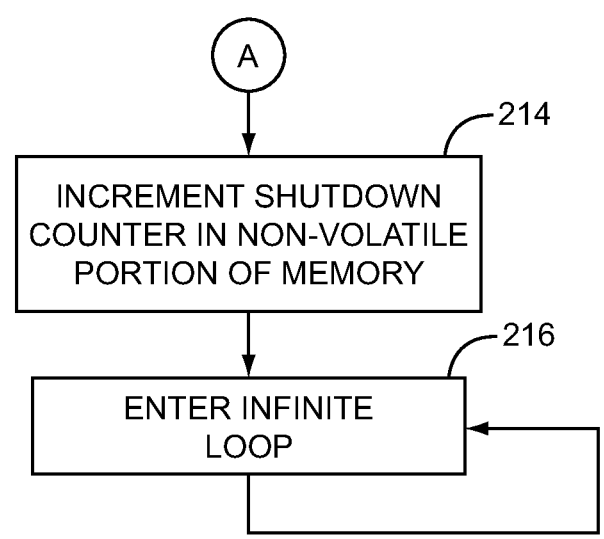
Figure 16:
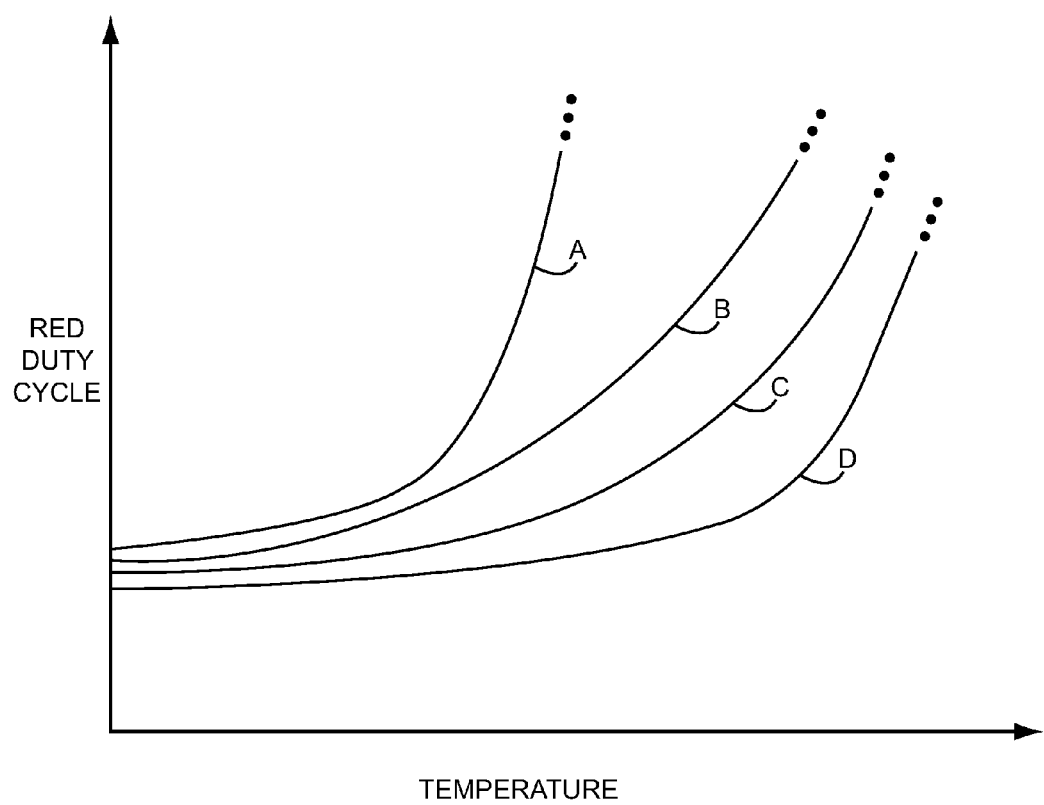
FIG. 16 is a graph of the duty cycle for a pulse width modulated signal used to drive a red LED versus temperature for four different LED arrays.

An exemplary process for detecting and responding to an overcurrent condition is shown in FIGS. 15A and 15B. Assume that that the system controller 76 in the lighting device of FIG. 9 is implementing the process. In this example, the overcurrent condition is defined as one where the drive current exceeds an overcurrent limit a set number of times. If the overcurrent condition is detected, the system controller 76 will take action to stop the flow of drive current through the LEDs D1-D7, which represents the entire array of LEDs 50 in the embodiment of FIG. 9. While not required, in this embodiment the system controller 76 is reset, such as by having the power provided from the power supply 12 cycled, prior to reinstating the drive current to the LEDs D1-D7.

The process starts after a system reset (step 200) wherein the an overcurrent counter provided by the system controller 76 and memory 84 is reset (step 202). The overcurrent counter is used to keep track of the overcurrent conditions that have occurred since the latest system reset.

In a substantially continuous or systematic fashion, the system controller 76 will measure the drive current delivered to the LEDs D1-D7 (step 204) and determine whether the measured drive current is greater than a predefined current limit (step 206). If the drive current is not greater than the current limit, the drive current continues to be measured and compared to the current limit. When the drive current does exceed the current limit (step 206), the overcurrent counter is incremented (step 208). Once the overcurrent counter is incremented, the system controller 76 determines whether the overcurrent counter is over a counter limit (step 210). The counter limit represents the number of times the drive current can exceed the current limit before entering a protection mode.

If the overcurrent counter is not over the counter limit, the drive current continues to be measured and compared to the current limit (steps 204 and 206). When the overcurrent counter exceeds the counter limit (step 210), the system controller 76 will open switch S1 to stop the drive current from flowing through LEDs D1-D7, and thus, turn off the array of LEDs 50 (212).

Additionally, the system controller 76 may increment a shutdown counter that is stored in a non-volatile portion of memory 84 and will remain intact if power is removed from the lighting device 10 (step 214). The shutdown counter effectively keeps a count of the number of overcurrent conditions that have required the system controller 76 to effectively shut down the array of LEDs 50 during the life of the lighting device 10. Once the overcurrent condition is detected and the shutdown counter is incremented, the system controller 76 may enter an infinite loop (step 216), which will prevent the array of LEDs 50 from being driven again until the system controller 76 is reset.

Depending on the processing capability and available memory associated with the system controller 76, various types and amounts of information may be logged in relation to the over-temperature conditions. For a more simplified embodiment, the system controller 76 may simply set a bit or store sufficient information in a non-volatile portion of memory 84 to indicate that at least one over-temperature, overcurrent, or over-voltage condition has occurred. Typically, the system controller 76 will immediately store the over-temperature, overcurrent, or over-voltage information upon detecting a corresponding condition before entering one of the above-described protection modes.

In one embodiment, the communication port 78 is used to deliver information though one port of the system controller 76. This port is initially configured as an input. However, once an over-temperature condition is detected, the system controller 76 may reconfigure the port to an output and set the output to a logic high or low. For example, the system controller 76 may reconfigure the port to an output and set the port to a logic low, which indicates that an over-temperature, overcurrent, or over-voltage condition has been experienced, by simply tying the port to ground. As such, an investigator may simply analyze the output level of the port to determine if at least one over-temperature or over-voltage condition has occurred. In one embodiment, the communication port 78 is an infrared sensor, which is coupled to the I/O (input/output) port of the system controller 76. Alternatively, the communication port 78 or other port may be used by a remote device to receive or access the information stored in memory 84.

In other embodiments, the system controller 76 may store one or more of the following:

the number of over-temperature conditions that have occurred, the temperatures associated with the over-temperature conditions, how long the over-temperature conditions lasted, the number of over-voltage conditions that have occurred, the voltages associated with the over-voltage conditions, how long the over-voltage conditions lasted, the number of overcurrent conditions that have occurred, the voltages associated with the overcurrent conditions, and how long the overcurrent conditions lasted.

Those skilled in the art will recognize other information that may be useful and stored for failure or performance diagnostics. In addition to performance and diagnostic information, manufacturing information, serial numbers, and the like may be stored in the non-volatile portion of memory 84, which may be integrated into the system controller 76, separate from the system controller 76, or a combination thereof. The information may be retrieved in any known manner through the communication port 78 or other I/O mechanism.

During normal operation, the operating temperatures of the lighting device 10, and in particular the array of LEDs 50, will vary. Unfortunately, the intensity and color of the light emitted from the various LEDs of the array of LEDs 50 often varies with temperature. Further, the red type LEDs and the BSY type LEDs react differently to temperature, and thus, the nature of the variations in intensity and color of the light emitted therefrom is different. However, the overall lighting objective for the lighting device 10 is generally to generate light at a desired intensity or lumen output as well as at a desired color temperature regardless of temperature. Accordingly, the following embodiments of the disclosure relate to ensuring the lighting device 10 is able to output light within a desired lumen and color temperature range throughout a normal range of operating temperatures.

For one embodiment, assume that the array of LEDs 50 may have different LED configurations depending on the required lumen output, color temperature, and the like for the lighting device 10. As such, the different arrays of LEDs 50 may have different types, numbers, or configurations of LEDs. Assume for the purpose of discussion that there are eight possible arrays of LEDs 50 that may be provided on the light source module 34 and may be controlled by the system controller 76. Only one of the eight different arrays of LEDs 50 will be provided on the light source module 34 and controlled by the system controller 76 at any given time. Further assume that each array of LEDs 50 will have some red type LEDs and some BSY type LEDs and that the system controller 76 will be able to vary the duty cycle of the PWM signal used to drive at least one of the red type LEDs, such as LED D7, and one of the BSY type LEDs, such as LED D5, as illustrated in FIG. 9.

For each of the different arrays of LEDs 50, a curve is initially developed to characterize the change required in the duty cycle used to drive the red type LED D7 to maintain a desired intensity and color temperature while the BSY type LED D5 is driven at a fixed duty cycle as the operating temperature of the light source module 34 changes. The fixed reference duty cycle used to drive the BSY type LED D5 is referred to as the pre-calibrated BSY duty cycle. FIG. 15 is a graph that illustrates four curves (A, B, C, and D) that could correspond to four different configurations of arrays of LEDs 50. Each curve is different and illustrates how the duty cycle used to drive the red type LED D7 should be increased as the operation temperature increases to maintain a consistent lumen output and color temperature from the lighting device for a fixed pre-calibrated BSY duty cycle. The different curves may be determined with the same or different pre-calibrated BSY duty cycles.

Each of the curves may be stored in a non-volatile portion of the memory 84 of the system controller 76 while the lighting device 10 is being manufactured and configured. The curves are stored such that overall operating temperature range is broken into segments, and each segment will be assigned a particular duty cycle with which to drive the red-type LED. Alternatively, the curves may be stored as a function that allows the system controller 76 to calculate a duty cycle based on the current operating temperature. In certain embodiments, the pre-calibrated BSY duty cycle for each curve may be stored in association with a corresponding curve. Again, the pre-calibrated BSY duty cycle may be fixed, and may be the same or different for each of the curves, depending on embodiment.

The lighting device 10 is manufactured with an array of LEDs 50, which corresponds to only one of the different curves that are stored in the memory 84. During the manufacturing process, the particular one of the curves to use for operation is identified to the system controller 76 via the communication port 78. For example, an infrared signal that indicates curve A should be used by the system controller 76 may be presented to the communication port 78, and the system controller 76 will store this information in the non-volatile portion of memory 84. If the curve information that is stored in memory 84 does not include the pre-calibrated BSY duty cycle, the pre-calibrated BSY duty cycle for the appropriate curve is also provided to the system controller 76 and stored in memory 84.

Next, the lighting device 10 may be powered up and allowed to warm up for calibration. During operation, the system controller 76 will determine the operating temperature and then determine the pre-calibrated duty cycle for the red type LED D7 based on the operating temperature in light of the selected curve information stored in memory 84. The system controller 76 will also determine the pre-calibrated BSY duty cycle associated with the identified curve, and then begin driving switch S2 with the pre-calibrated duty cycle for the red type LED D7 and switch S3 with the selected pre-calibrated BSY duty cycle. At this point, the lighting device 10 is providing pre-calibrated light, which may not meet the manufacture's specifications for lumens, color temperature, and the like.

The pre-calibrated light is analyzed and a determination is made as to whether the pre-calibrated light meets the manufacturer's specifications. If the specifications are not met, offsets for one or both of the pre-calibrated red duty cycle and the pre-calibrated BSY duty cycle are calculated. The offsets in the duty cycles are intended to be sufficient to ensure that the light output from the lighting device 10 meets the manufacture's specifications. The offsets are then presented to the system controller 76 of the lighting device 10 via the communication port 78 and stored in a non-volatile portion of the memory 84.

In one embodiment, the system controller 76 will function as follows once these offsets are stored. The system controller 76 will determine the operating temperature and then determine the pre-calibrated red duty cycle based on the operating temperature in light of the curve information stored in memory 84. The system controller 76 will then add the offset for the red duty cycle to the pre-calibrated red duty cycle to provide a calibrated duty cycle for the red type LED D7. The system controller 76 will then begin driving switch S2 with the calibrated duty cycle for the red type LED D7. In this embodiment, the offset for the red duty cycle is fixed and does not vary with operating temperature; however, this is not required. The offset for the red duty cycle may vary over operating temperature range. For example, the offset for the red duty cycle may be different for different segments of the operating temperature range.

Similarly, the offset for the BSY duty cycle is added to the pre-calibrated BSY duty cycle associated with the identified curve to provide a calibrated BSY duty cycle. The system controller 76 will then begin driving switch S3 with the calibrated BSY duty cycle. At this point, the lighting device 10 is providing calibrated light, which should meet the manufacture's specifications for lumens, color temperature, and the like.

In other embodiments, curves may also be developed and used for the BSY duty cycles as a function of temperature. As such, curves for both red and BSY type LEDs may be stored in memory 84 wherein offsets for one or both of the selected red and BSY duty cycles may be determined during calibration, sent to the lighting device 10, and applied during operation of the lighting device 10. As noted above, the concepts provided herein apply to all types of arrays of LEDs 50 that employ different types of LEDs, and are not limited to arrays of LEDs 50 with red or BSY type LEDs.

Those skilled in the art will recognize improvements and modifications to the embodiments of the present disclosure.

All such improvements and modifications are considered within the scope of the concepts disclosed herein and the claims that follow.

What is claimed is:

1. A lighting device comprising:
   a first string of LEDs and a first switch coupled in series between a power supply node and ground;
   a system controller configured to:
      monitor a drive current delivered to the first string of LEDs;
      detect an overcurrent condition based on monitoring the drive current; and
      upon detecting the overcurrent condition, open the first switch to stop the drive current from flowing through the first string of LEDs; and
   voltage sensing circuitry configured to provide a signal indicative of a voltage at the power supply node where the system controller is configured to keep the first switch open upon detecting the overcurrent condition until the voltage at the power supply node is below a defined threshold.

2. The lighting device of claim 1 wherein the system controller is further configured to close the first switch after the voltage at the power supply node falls below the defined threshold.

3. The lighting device of claim 1 wherein the overcurrent condition occurs when the drive current for the first string of LEDs has exceeded a defined threshold.

4. The lighting device of claim 1 wherein the overcurrent condition occurs when the drive current for the first string of LEDs has exceeded a defined threshold for a given period of time.

5. The lighting device of claim 1 wherein the overcurrent condition occurs when the drive current for the first string of LEDs has exceeded a defined threshold more than a set number of times.

6. The lighting device of claim 1 wherein the overcurrent condition occurs when an average of the drive current for the first string of LEDs has exceeded a defined level threshold for a given period of time.

7. The lighting device of claim 1 wherein light emitted from the lighting device is white light at a desired color temperature.

8. The lighting device of claim 7 wherein the first string of LEDs comprises a plurality of series connected LEDs.

9. The lighting device of claim 8 wherein the plurality of series connected LEDs comprises a plurality of LEDs of a first type that emit light of a first color and a plurality of LEDs of a second type that emit light of a second color.

10. The lighting device of claim 9 wherein the light of the first color is reddish light and the light of the second color is one of greenish light and yellowish light.

11. The lighting device of claim 9 further comprising a second switch coupled across at least one of the plurality of LEDs of the first type and a third switch coupled across at least one of the plurality of LEDs of the second type, wherein during a normal operation mode, the system controller is further configured to operate the second switch with a first pulse width modulated signal to control a relative intensity of the at least one of the plurality of LEDs of the first type and operate the third switch with a second pulse width modulated signal to control a relative intensity of the at least one of the plurality of LEDs of the second type.

12. The lighting device of claim 11 wherein the first pulse width modulated signal has a first duty cycle that is variable, the second pulse width modulated signal has a second duty cycle that is variable, and the system controller is configured to vary the first duty cycle and the second duty cycle based on an operating temperature derived from a temperature sensor.

13. The lighting device of claim 1 further comprising a power supply port, which is configured to receive DC power from a power supply that is separate from the lighting device.

14. The lighting device of claim 1 wherein the first switch is a transistor.

15. A lighting device comprising:
   a first string of LEDs and a first switch coupled in series between a power supply node and ground; and
   a system controller having an input/output port that is initially configured as an input port for receiving communications from an external device, the system controller configured to:
      monitor a drive current delivered to the first string of LEDs;
      detect an overcurrent condition based on monitoring the drive current;
      upon detecting the overcurrent condition:
         open the first switch to stop the drive current from flowing through the first string of LEDs; and
         reconfigure the input/output port as an output port and set the output port to a logic level indicative of the lighting device having experienced the overcurrent condition.

16. The lighting device of claim 15 wherein to set the output port to the logic level indicative of the lighting device having experienced the overcurrent condition, the output port is tied to ground.

17. The lighting device of claim 15 wherein the input/output port is coupled to a wireless communication sensor.

18. The lighting device of claim 17 wherein the wireless communication sensor is an infrared sensor.

19. A lighting device comprising:
   a first string of LEDs and a first switch coupled in series between a power supply node and ground; and
   a system controller associated with memory, the system controller configured to:
      monitor a drive current delivered to the first string of LEDs;
      detect an overcurrent condition based on monitoring the drive current; and
      upon detecting the overcurrent condition, open the first switch to stop the drive current from flowing through the first string of LEDs; and
      store information that indicates the overcurrent condition has occurred upon detecting the overcurrent condition.

20. The lighting device of claim 19 wherein the system controller is configured to store the information for each overcurrent condition that occurs.

21. The lighting device of claim 19 wherein the system controller is configured to keep track of a number of overcurrent conditions that have occurred.

22. A lighting device comprising:
   a first string of LEDs and a first switch coupled in series between a power supply node and ground;
   a system controller configured to:
      monitor a drive current delivered to the first string of LEDs;
      detect an overcurrent condition based on monitoring the drive current;
      upon detecting the overcurrent condition, open the first switch to stop the drive current from flowing through the first string of LEDs; and a second string of LEDs, wherein the second string of LEDs and the first switch are coupled in series between the power supply node and ground.

23. A lighting device comprising:
a first string of LEDs and a first switch coupled in series between a power supply node and ground;
a system controller configured to:
monitor a drive current delivered to the first string of LEDs;
detect an overcurrent condition based on monitoring the drive current;
upon detecting the overcurrent condition, open the first switch to stop the drive current from flowing through the first string of LEDs; and
a second string of LEDs and a second switch coupled in series between the power supply node and ground wherein the system controller is configured to:
operate the second switch during a normal operation mode to deliver a drive current to the second string of LEDs; and
upon detecting the overcurrent condition, open the second switch to stop the drive current from flowing through the second string of LEDs.

24. A lighting device comprising:
a first string of LEDs and a first switch coupled in series between a power supply node and ground; and
a system controller configured to:
monitor a drive current delivered to the first string of LEDs;
detect an overcurrent condition based on monitoring the drive current; and
upon detecting the overcurrent condition, open the first switch to stop the drive current from flowing through the first string of LEDs, wherein the first switch is kept open until the system controller is reset; and
operate the first switch after the system controller is reset to allow the drive current to be delivered to the first string of LEDs.

25. The lighting device of claim 24 wherein the system controller is reset when a voltage powering the system controller is dropped below a level that will allow the system controller to operate and then raised above the level that will allow the system controller to operate.

26. The lighting device of claim 25 wherein the system controller derives power from the power supply node and the system controller is reset when power at the power supply node is turned off and then turned back on.

27. The lighting device of claim 25 wherein the first string of LEDs comprises a plurality of LEDs of a first type that emit light of a first color and a plurality of LEDs of a second type that emit light of a second color.

28. The lighting device of claim 24 wherein the system controller is further configured to control the first switch to cause the drive current to flow through the first string of LEDs after being reset.

29. A method for controlling a drive current comprising:
monitoring a drive current delivered to the first string of LEDs;
detecting an overcurrent condition based on monitoring the drive current;
upon detecting the overcurrent condition, opening the first switch to stop the drive current from flowing through the first string of LEDs, wherein the first switch is kept open until the system controller is reset; and
operating the first switch after the system controller is reset to allow the drive current to be delivered to the first string of LEDs.

* * * * *